(12) United States Patent
Mohaghegh

(10) Patent No.: US 10,954,766 B2
(45) Date of Patent: Mar. 23, 2021

(54) METHODS, SYSTEMS, AND COMPUTER-READABLE MEDIA FOR EVALUATING SERVICE COMPANIES, IDENTIFYING CANDIDATE WELLS AND DESIGNING HYDRAULIC REFRACTURING

(71) Applicant: Intelligent Solutions, Inc., Morgantown, WV (US)

(72) Inventor: Shahab D. Mohaghegh, Morgantown, WV (US)

(73) Assignee: INTELLIGENT SOLUTIONS, INC., Morgantown, WV (US)

( * ) Notice: Subject to any disclaimer, the term of this patent is extended or adjusted under 35 U.S.C. 154(b) by 755 days.

(21) Appl. No.: 15/481,869

(22) Filed: Apr. 7, 2017

(65) Prior Publication Data
US 2017/0292357 A1    Oct. 12, 2017

Related U.S. Application Data

(60) Provisional application No. 62/319,938, filed on Apr. 8, 2016.

(51) Int. Cl.
*E21B 43/26* (2006.01)
(52) U.S. Cl.
CPC ................... *E21B 43/26* (2013.01)
(58) Field of Classification Search
CPC .................................................. E21B 43/26
USPC ........................................................ 703/10
See application file for complete search history.

(56) References Cited

U.S. PATENT DOCUMENTS

| | | | | |
|---|---|---|---|---|
| 6,076,046 A * | 6/2000 | Vasudevan | ............ | E21B 43/267 166/250.08 |
| 6,795,773 B2 * | 9/2004 | Soliman | .................. | E21B 43/26 166/250.1 |
| 7,389,185 B2 * | 6/2008 | Craig | .................... | E21B 49/008 702/13 |
| 7,516,793 B2 * | 4/2009 | Dykstra | ............... | E21B 43/267 166/177.5 |

(Continued)

OTHER PUBLICATIONS

T. Hajati (A statistical model for seismic hazard assessment of hydraulic-fracturing-induced seismicity, 2015, American Geophysical Union, pp. 1-6) (Year: 2015).*

(Continued)

*Primary Examiner* — Iftekhar A Khan
(74) *Attorney, Agent, or Firm* — Carter, DeLuca & Farrell LLP

(57) ABSTRACT

For each well of the plurality of wells, a plurality of model outputs are generated for the well. A range of productivity is determined for the well by plotting the plurality of model outputs in the form of a probability distribution function, projecting an actual production indicator result for the well onto the probability distribution function, comparing the actual production indicator result and the probability distribution function to identify a well production potential for the well, and determining a quality of the well production potential based on a plurality of categorization rules including a lowest quality category and a highest quality category. All of the wells in the plurality of wells are analyzed to identify wells in the highest quality category based on the determined quality of well production potentials for the plurality of wells for hydraulic refracturing.

15 Claims, 14 Drawing Sheets

(56) References Cited

U.S. PATENT DOCUMENTS

| | | | | |
|---|---|---|---|---|
| 7,770,647 B2* | 8/2010 | Watson | E21B 43/267 | 166/280.1 |
| 8,386,226 B2* | 2/2013 | Craig | E21B 43/16 | 166/250.01 |
| 8,392,165 B2* | 3/2013 | Craig | E21B 43/26 | 703/10 |
| 8,437,962 B2* | 5/2013 | Craig | E21B 43/26 | 166/308.1 |
| 8,469,099 B2* | 6/2013 | Watson | E21B 43/267 | 166/280.1 |
| 9,176,245 B2* | 11/2015 | Craig | G01V 1/282 | |
| 9,631,468 B2* | 4/2017 | Miller | E21B 43/26 | |
| 10,417,561 B2* | 9/2019 | Mohaghegh | G06N 3/08 | |
| 2005/0222852 A1* | 10/2005 | Craig | E21B 49/008 | 166/305.1 |
| 2007/0083331 A1* | 4/2007 | Craig | E21B 49/008 | 702/13 |
| 2009/0010104 A1* | 1/2009 | Leaney | G01V 1/364 | 367/47 |
| 2009/0250211 A1* | 10/2009 | Craig | E21B 49/008 | 166/250.16 |
| 2010/0307755 A1* | 12/2010 | Xu | E21B 43/26 | 166/308.1 |
| 2011/0067857 A1* | 3/2011 | Underhill | E21B 47/06 | 166/250.01 |
| 2011/0120705 A1* | 5/2011 | Walters | E21B 43/16 | 166/270 |
| 2011/0120706 A1* | 5/2011 | Craig | E21B 43/26 | 166/270 |
| 2011/0120718 A1* | 5/2011 | Craig | E21B 43/16 | 166/308.1 |
| 2011/0125476 A1* | 5/2011 | Craig | G01V 1/288 | 703/10 |
| 2013/0233542 A1* | 9/2013 | Shampine | E21B 43/267 | 166/279 |
| 2014/0025413 A1* | 1/2014 | Yeager | G06Q 10/0631 | 705/7.12 |
| 2014/0216736 A1* | 8/2014 | Leugemors | E21B 43/26 | 166/266 |
| 2015/0060063 A1* | 3/2015 | Miller | E21B 43/26 | 166/279 |
| 2015/0204176 A1* | 7/2015 | Cunningham | E21B 43/26 | 166/281 |
| 2016/0034818 A1* | 2/2016 | Knecht | G06G 7/48 | 166/308.1 |
| 2016/0042272 A1* | 2/2016 | Mohaghegh | E21B 43/30 | 706/19 |
| 2016/0047942 A1* | 2/2016 | Chorn | G01V 99/005 | 702/2 |
| 2016/0090823 A1* | 3/2016 | Alzahabi | E21B 43/30 | 703/2 |
| 2016/0145977 A1* | 5/2016 | Chugunov | E21B 43/16 | 703/2 |
| 2016/0259088 A1* | 9/2016 | Carvajal | E21B 41/00 | |
| 2016/0312552 A1* | 10/2016 | Early | E21B 41/00 | |
| 2016/0326845 A1* | 11/2016 | Djikpesse | E21B 43/00 | |
| 2016/0370499 A1* | 12/2016 | Berard | G01V 99/00 | |
| 2017/0051598 A1* | 2/2017 | Ouenes | G06F 30/20 | |
| 2017/0114616 A1* | 4/2017 | Enkababian | E21B 43/16 | |
| 2017/0122077 A1* | 5/2017 | Shahri | G06F 30/20 | |
| 2017/0124228 A1* | 5/2017 | Shahri | E21B 43/261 | |
| 2017/0145793 A1* | 5/2017 | Ouenes | E21B 43/26 | |
| 2018/0202264 A1* | 7/2018 | Sarduy | E21B 49/08 | |

OTHER PUBLICATIONS

Potapenko et al. (Barnett Shale Refracture Stimulations Using a Novel Diversion Technique, 2009, SPE, pp. 1-11) (Year: 2009).*

Sinha et al. ("A Novel Screening Method for Selection of Horizontal Refracturing Candidates in Shale Gas Reservoirs", SPE 2011, pp. 1-10) (Year: 2011).*

Qin et al. ("Data-driven Monte Carlo Simulations in Estimating the Stimulated Reservoir Volume (SRV) by Hydraulic Fracturing Treatments", SPE, 2012, pp. 1-11) (Year: 2012).*

* cited by examiner

METHODS, SYSTEMS, AND COMPUTER-READABLE MEDIA FOR EVALUATING SERVICE COMPANIES, IDENTIFYING CANDIDATE WELLS AND DESIGNING HYDRAULIC REFRACTURING

TECHNICAL FIELD

The present disclosure relates to methods and systems for identifying candidate wells to be hydraulically refractured and for optimizing the hydraulic fracture design of the identified wells.

BACKGROUND

In recent years, hydraulic fracturing has been commonplace in the extraction of hydrocarbon from the earth. To perform hydraulic fracturing, a well site first is drilled at a location suspected of being within a shale reservoir. A slurry of water, proppant, and other additives are pressurized and introduced into the shale reservoir to thereby release the hydrocarbon, if any, that may have been generated or trapped therein. The pressurized slurry forces the hydrocarbon (by fracturing the rock) to travel through pipes or other delivery mechanisms to the earth's surface for collection at the well site. To fully exploit the potential yield of a shale reservoir, the hydraulic fracturing operation is performed on a first length of the shale reservoir (commonly referred to as a "stage"), then performed on a second adjacent length or stage of the shale reservoir and so on. In some cases, a full length of the shale reservoir is divided into ten to thirty (or more) stages.

As the number of hydraulically fractured well sites has risen over the years, the completion and production of tens of thousands of wells characterized by initially high production followed by a sharp decline has driven drilling companies toward revisiting some of these sites. For example, it is widely accepted that at least forty percent of hydraulic fracture stages of drilled shale wells typically do not contribute to production. Moreover, in the stages that contribute to production, the depletion of the shale reservoir of hydrocarbon typically modifies the stresses of the shale reservoir thereby potentially changing the orientations and propagation of the new hydraulic fractures in the stages. As a result, new reservoirs may be accessed for the production of hydrocarbon volumes that had been missed during the original hydraulic fracturing.

SUMMARY

Methods, systems, and computer-readable media are provided for identifying candidate shale wells from wells that have already been hydraulically fractured. Once identified, the methods, systems, and computer-readable media optimize the designs of the hydraulic fractures for the candidate shale wells.

A computer-implemented method is provided for identifying a well from a plurality of wells for hydraulic refracturing. The method includes for each well of the plurality of wells: generating a plurality of model outputs for the well, and determining a range of productivity for the well. To determine the range of productivity, the plurality of model outputs are plotted for the well in the form of a probability distribution function, an actual production indicator result for the well is projected onto the probability distribution function, the actual production indicator result and the probability distribution function are compared to identify a well production potential for the well, and a quality of the well production potential is determined based on a plurality of categorization rules including a lowest quality category and a highest quality category to obtain a result. The results of all of the wells in the plurality of wells are analyzed to identify wells in the highest quality category based on the determined quality of well production potentials for the plurality of wells for hydraulic refracturing.

In an embodiment, the generating the plurality of model outputs includes executing a Monte Carlo simulation to produce the plurality of model outputs.

In another embodiment, the generating the plurality of model outputs includes using a first group of parameters and a second group of parameters to obtain corresponding production indicator results, the first group of parameters including well construction parameters, reservoir characteristic parameters and operational constraint parameters and the second group of input parameters including completion parameters and hydraulic fracturing parameters, wherein at least one parameter of the first group of parameters is a constant and the second group of parameters are varied.

In still another embodiment, the reservoir characteristic parameters are constant. In still yet another embodiment, the well construction parameters are also constant.

In another embodiment, the method also includes identifying a total number of wells that fall into each category defined by the plurality of categorization rules.

In still another embodiment of the method, for each well: a difference is determined between the actual production indicator result and an expected average production value for the well, a difference is determined between the actual production indicator result and an expected best production value for the well and ranking results of the determined difference from highest to lowest to produce a second ranking. Then, results of the determined differences between the actual production indicator result and an expected average production value are sorted for all of the wells of the plurality of the wells from highest to lowest to obtain a first ranking, results of the determined difference between the actual production indicator result and an expected best production value are sorted for all of the wells of the plurality of the wells from highest to lowest to obtain a second ranking. The first ranking is weighted relative to the second ranking and combining the rankings to generate a final ranking to identify candidate wells for hydraulic refracturing.

A non-transitory computer-readable storage medium is also provided for storing instructions that when executed cause a computer to perform a method of identifying a well from a plurality of wells for hydraulic refracturing including, for each well of the plurality of wells: generating a plurality of model outputs for the well, and determining a range of productivity for the well by: plotting the plurality of model outputs in the form of a probability distribution function, projecting an actual production indicator result for the well onto the probability distribution function, comparing the actual production indicator result and the probability distribution function to identify a well production potential for the well, and determining a quality of the well production potential based on a plurality of categorization rules including a lowest quality category and a highest quality category. All of the wells in the plurality of wells are analyzed to identify wells in the highest quality category based on the determined quality of well production potentials for the plurality of wells for hydraulic refracturing.

A system is provided for performing a method of identifying a well from a plurality of wells for hydraulic refracturing. The system includes one or more processors, and a memory coupled to the one or more processors, having instructions stored thereon which when executed by the one or more processors cause the one or more processors to, for each well of the plurality of wells: generate a plurality of model outputs for the well, and determine a range of productivity for the well. The determining includes plotting the plurality of model outputs in the form of a probability distribution function, projecting an actual production indicator result for the well onto the probability distribution function, comparing the actual production indicator result and the probability distribution function to identify a well production potential for the well, and determining a quality of the well production potential based on a plurality of categorization rules including a lowest quality category and a highest quality category. All of the wells in the plurality of wells are analyzed to identify wells in the highest quality category based on the determined quality of well production potentials for the plurality of wells for hydraulic refracturing.

Any of the above aspects and embodiments of the present disclosure may be combined without departing from the scope of the present disclosure.

BRIEF DESCRIPTION OF THE DRAWINGS

The above and other aspects, features, and advantages of the present disclosure will become more apparent in light of the following detailed description when taken in conjunction with the accompanying drawings, in which.

DETAILED DESCRIPTION

Methods, systems, and computer-readable media are provided for identifying candidate shale wells from among a plurality of shale wells for hydraulic refracturing and for optimizing the design of the top ones of these candidate shale wells. The provided methods may also be implemented for comparing the quality of completion of a hydraulic fracturing between a plurality of shale wells to, for example, compare different service operator performances. Generally, advanced data-driven analytics and a "look-back analysis," during which a predictive model is implemented, are used for the methods.

Figure 1:
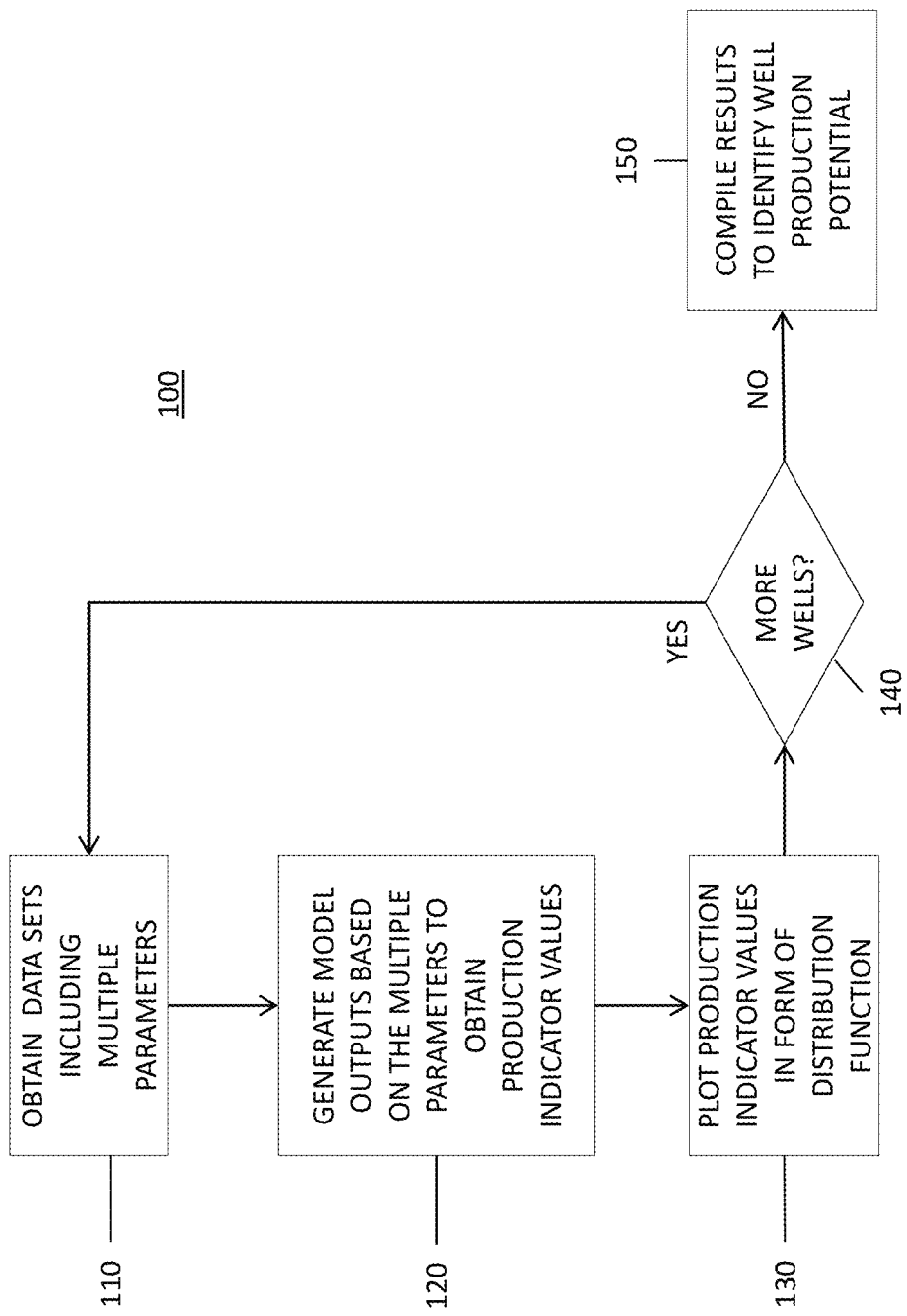
FIG. 1 is a flow diagram of a method of performing a look-back analysis on data related to shale wells, according to an embodiment.

Referring to FIG. 1 a method 100 for performing a look-back analysis on data related to shale wells, is illustrated in accordance with an embodiment. To execute method 110, a plurality of shale wells on which hydraulic fracturing has previously been performed are first identified. The plurality of shale wells may number in the hundreds or thousands and may be in a single asset or may span across multiple assets. As these shale wells have already been drilled, data relating to how the well was designed and constructed, what the characteristics of the shale reservoir, and what designs were implemented to extract hydrocarbon from the shale reservoir are obtained. The look-back analysis includes executing predictive modeling using the data related to the plurality of shale wells to identify the quality of hydraulic fracturing operations that have been performed in the past on the plurality of shale wells.

Figure 2:
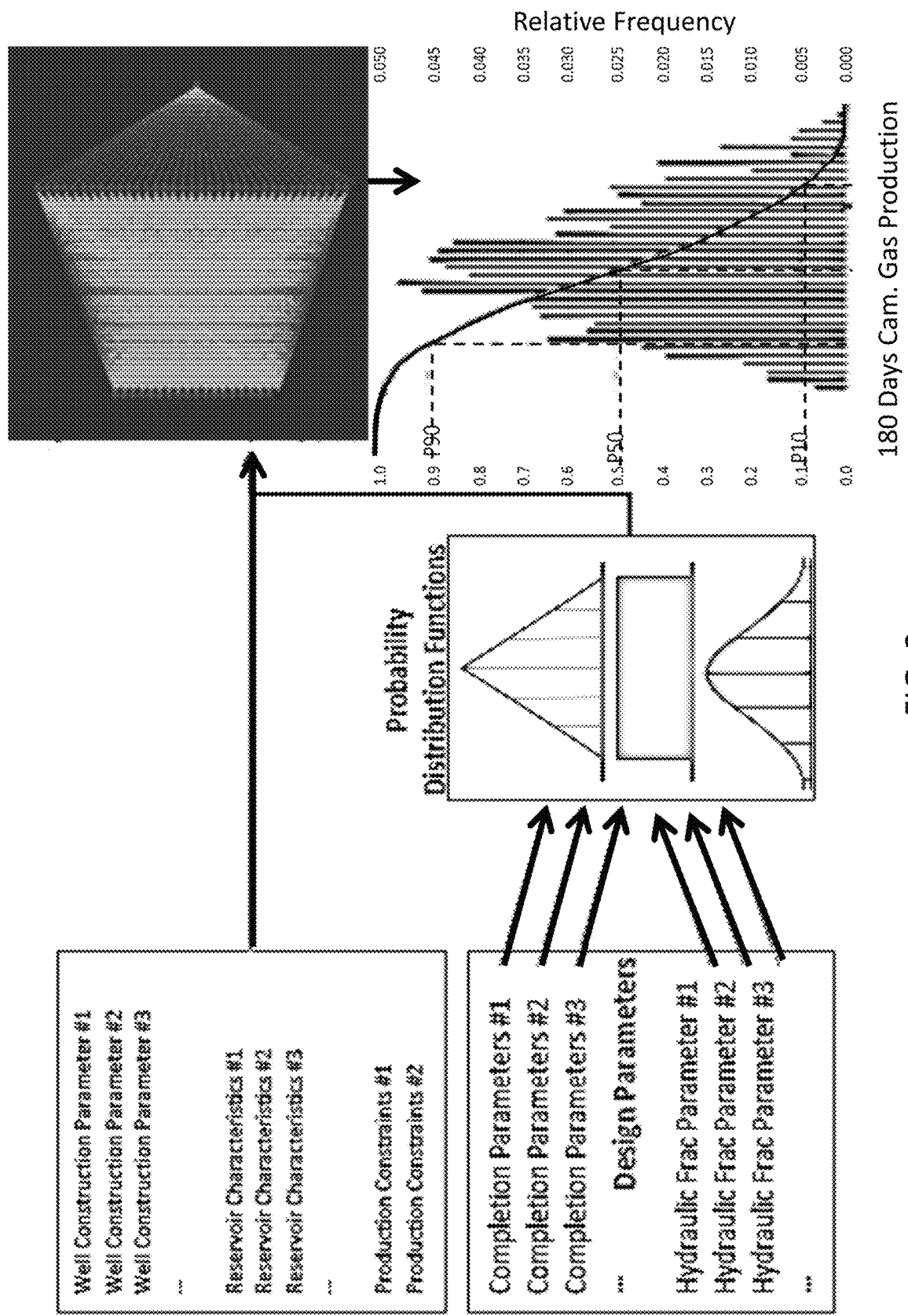
FIG. 2 is a schematic illustration of the method of performing the look-back analysis of FIG. 1, in accordance with an embodiment.

After the desired data is identified, data sets including multiple parameters are obtained at step 110, for example, from the identified desired data. For the purposes of the analysis, parameters in the predictive model are divided into two groups (as shown in FIG. 2). A first group of parameters includes well construction parameters, reservoir characteristic parameters, and operational or production constraint parameters. Well construction parameters include characteristics of the already-built well, such as a total measured depth of the well, the inclination of the well, including whether the well has an up dip, a down dip or no dip and the like. Reservoir characteristic parameters include, but are not limited to, particular characteristics of the shale reservoir including the age, porosity, water saturation, thickness, and/or total organic content measurement of the reservoir and the like. Operation or production constraint parameters include, but are not limited to, factors such as well-head pressure, whether the hydrocarbon flows on its own or chokes back, and the like. A second group of parameters, referred to as "Design Parameters," includes completion parameters and hydraulic fracturing parameters. These parameters may be selected by a well-designer. Specifically, the completion parameters include, but are not limited to parameters related to the structure of the well, for example the length of the well, length of each stage of the well, how many stages are used to form a cluster, how many shots per foot, how many perforations are made in each stage, and the like. Hydraulic fracturing parameters include, but are not limited to a selection of the types of fluid or proppant that are pumped into a shale reservoir, the amount of fluid pumped into the reservoir, the particular practice or "recipe" used for the operation, and the like. The combination of the parameters in the second group, as well as the production constraints of the particular shale well, contribute to the degree of productivity of the well. Such parameters are obtained for all of the plurality of shale wells that have already been hydraulically fractured and have produced hydrocarbon for a certain amount of time.

Referring again to FIG. 1, at step 120, model outputs are generated based on the multiple parameters to obtain production indicator results. In an embodiment, to obtain the model outputs from the execution of the predictive modeling, the modeling is executed with the first group of parameters being maintained constant while the second group of parameters being varied. According to another embodiment, an algorithm used in the predictive modeling is based on the Monte Carlo Simulation technique. For example, each time the predictive model is executed and inputs from the first group of parameters are maintained constant, the variables of the second group of parameters are selected randomly to form a new combination.

In an embodiment, each time the combination of the second group of parameters are selected randomly based on the assigned a probability distribution function as shown in FIG. 2, a new production indicator (for example, 180 days cumulative gas production) is calculated. Any probability distribution functions can be assigned at this point. During the analysis, the Monte Carlo Simulation is executed thousands of times for each well to produce an output model for each time for the corresponding well, resulting in thousands of production indicator results for each of the wells. The production indicator results represent completion and stimulation practices for a corresponding well thereby providing a complete range of possible production outputs from the given well.

A range of productivity for each well of the plurality of wells is determined at step 130. In an embodiment, the production indicator results are plotted in the form of a probability distribution function from which probabilities are calculated. The production indicator results can be used to determine the minimum production, the maximum production, and the average production that could have been expected from the well. To determine the probability of production yields of each well (for example, the "Px" value), the probabilities can be divided and categorized in any one of numerous manners useful for identifying a quality of a well production potential. For instance the following categorization rules may be applied, in an embodiment:

a. If the well produces at any values that is above P20 (of its potential), the quality of the fracturing operation is identified as "Excellent,"

b. If the well produces at any values that is between P40 to P20 (of its potential), the quality of the fracturing operation is identified as "Better than Expected,"

c. If the well produces at any values that is between P60 to P40 (of its potential), the quality of the fracturing operation is identified as "As Expected,"

d. If the well produces at any values that is between P80 to P60 (of its potential), the quality of the fracturing operation is identified as "Worse than Expected,"

e. If the well produces at any values that is below P80 (of its potential), the quality of the fracturing operation is identified as "Poor."

Once the above rules are in place, then the actual production indicator result calculated for the well is projected on to the probability distribution function and the quality of the well production potential is determined based on the categorization rules. Specifically, a determination is made as to where the actual production indicator result falls within one of the ranges of probabilities.

Figure 3:
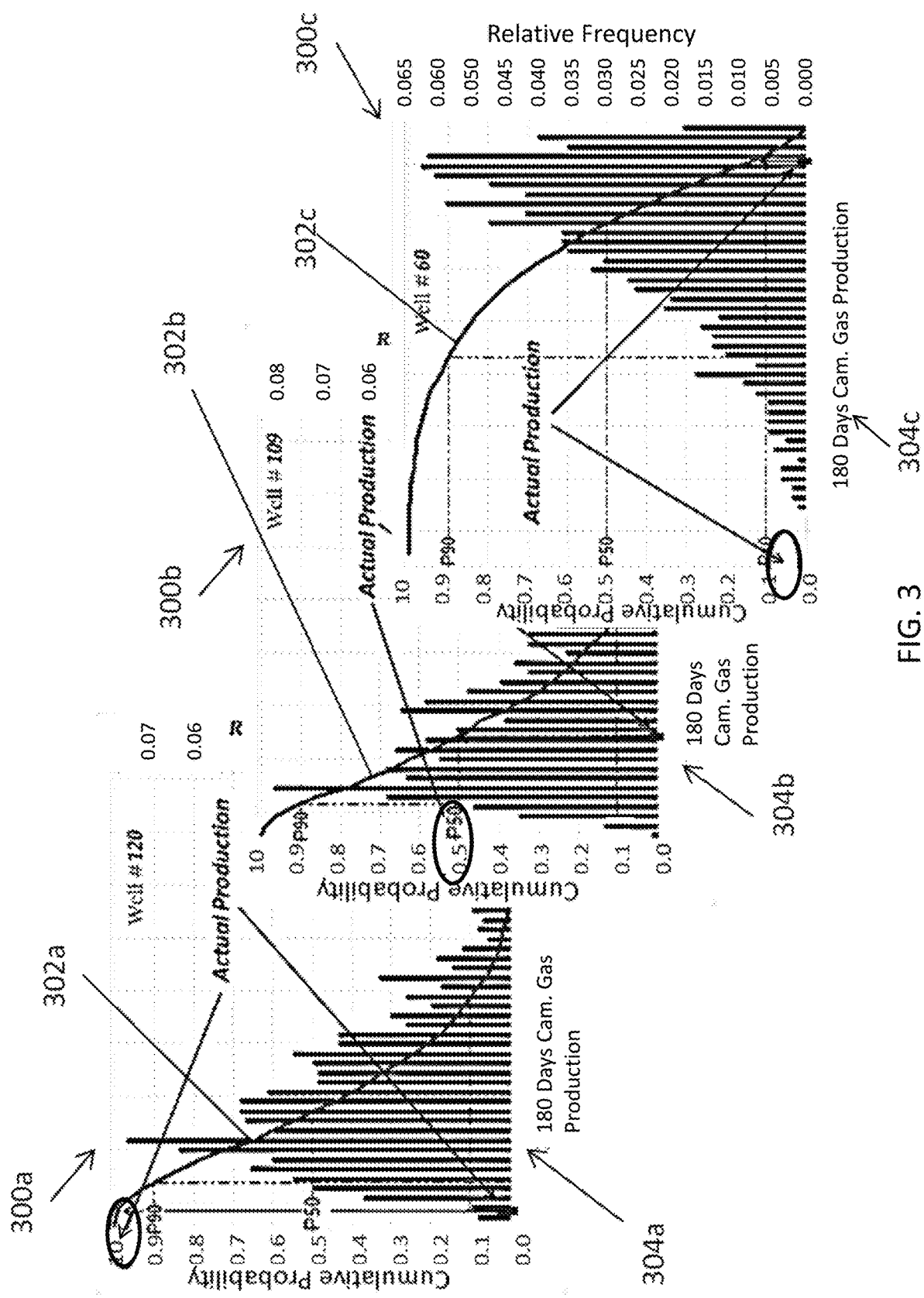
FIG. 3 are graphs illustrating look-back analyses performed on three different wells in a shale asset.

FIG. 3 shows a series of graphs which illustrate results of the analysis performed on three shale wells completed in Marcellus Shale in Pennsylvania, United States. Here, in each of the graphs 300a, 300b, 300c, lines 302a, 302b, 302c are plots of the production indicator results for each of the three shale wells. The vertical bars 304a, 304b, 304c are plotted actual historical productivity values over a period of 180 days for each of the wells. As shown in graph 300a completion of Well #120 is classified as "Poor" since the actual (historical) productivity (180 days of cumulative production) of this well falls below/above? P90 (e.g., P97). In graph 300b, the completion of Well #109 is classified as "As Expected" because the actual (historical) productivity (180 days of cumulative production) of this well is P52, which is between P60 to P40 (of its potential). Lastly, as shown in graph 300c, the completion of Well #60 is classified as "Excellent" since the actual (historical) productivity (180 days of cumulative production) of this well fall on P-5, which falls within the range of above P20.

Steps 110 through 130 are repeated until all of the shale well in an asset portfolio are analyzed at step 140, at which point, the results are compiled to identify well production potential at step 150, for example, wells in each category such as a highest quality category to a lowest quality category. The results are used in order to identify the total number (and percentages) of the shale wells that fall into each of the five categories of quality of a well production potential defined by the categorization rules, also referred to as "completion quality."

Figure 4:
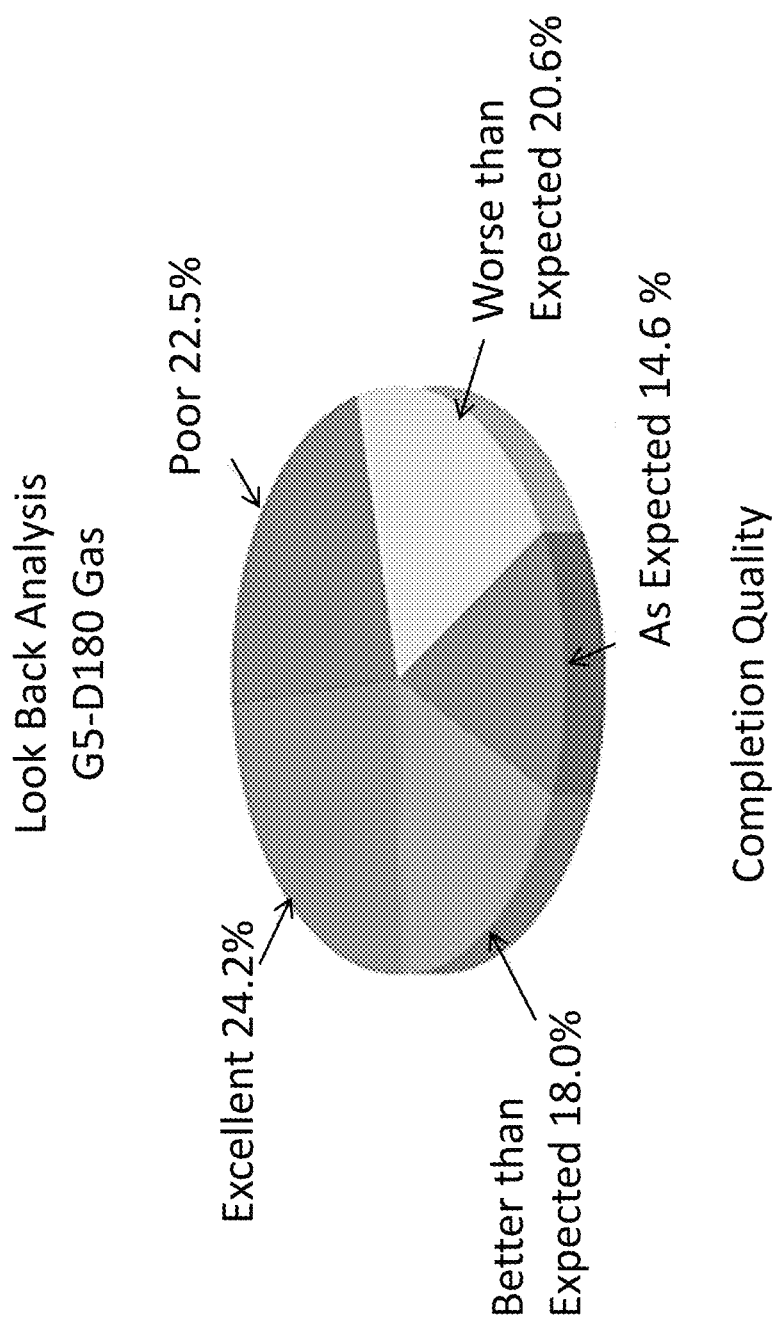
FIG. 4 is a graph illustrating a complete look back analysis performed on a Utica shale asset.

Referring now to FIG. 4, the results of a "Look-Back" analysis performed on a Utica shale asset in Ohio are shown. In this asset, 43.1% of the wells were completed and hydraulically fractured poorly or worse than expected. Thus, more hydrocarbon or fuel could have been produced from these wells. Also indicated in the graph, about 42.2% of the wells were completed and hydraulically fractured better than average. Additionally, about 14.6% of the wells were hydraulically fractured as expected, and hydrocarbon production from these wells were the range of expected values. By employing data-driven analytics, overall expectations from the completion may be improved.

In addition to identifying candidate shale wells to be hydraulically refractured, the look-back analysis described above may be used to compare completion job performance among different shale well service companies. For example, by keeping the reservoir characteristics constant for each well during the analysis, the impact of completion and hydraulic fracturing parameters on the production may be isolated to thereby permit a comparison of the quality of completion and hydraulic fracturing practices between different service companies.

Figure 5:
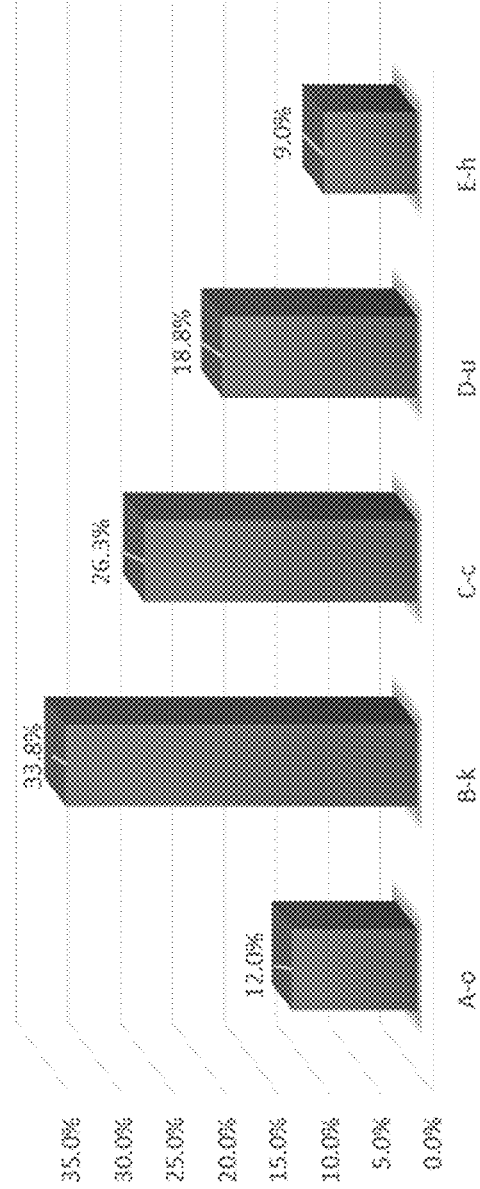
FIG. 5 is a graph illustrating a percent of wells completed by five service companies.
Figure 6:
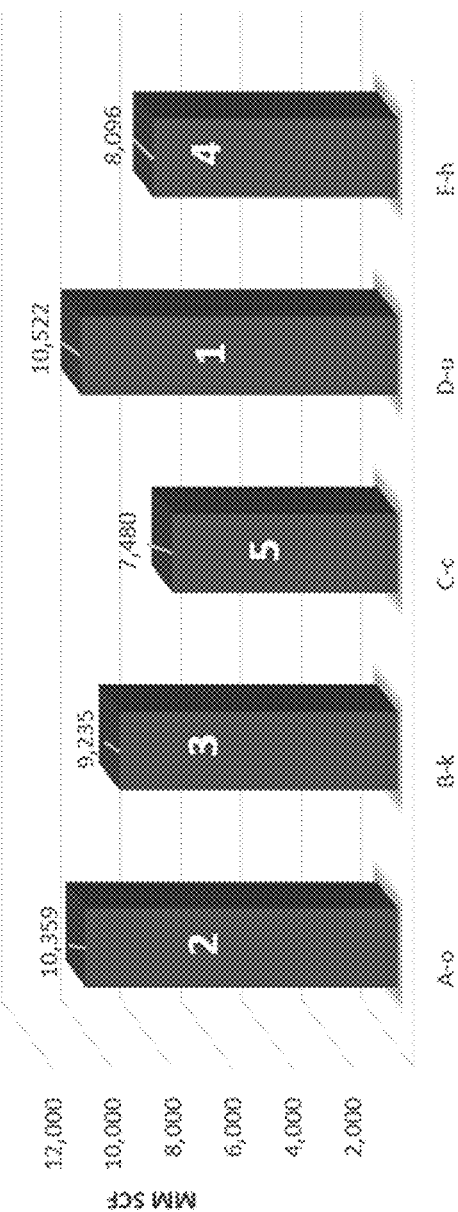
FIG. 6 is a graph illustrating an average well productivity for each service company.

In an example, the look-back analysis was applied to data related to a Marcellus shale asset that included more than two hundred wells to compare the completion job performance and hydraulic fracturing practices of five service companies involved in the asset. FIG. 5 shows the percentage of the wells in the asset completed and hydraulically fractured by each of the five service companies. FIG. 6 illustrates the average well productivity for each of the service companies included in FIG. 5. Specifically, the graph of FIG. 6 demonstrates the average productivity (180 days cumulative gas production) of wells that has been completed by each of the service companies.

As it can be seen from FIGS. 5 and 6, Company "E-h" completed the least number of wells (9.0% of all the wells in the asset) with an average 180 days cumulative gas production of about 8 million standard cubic feet (SCF) per well, while Company "B-k" completed the most number of wells (33.8% of all the wells in the asset) with an average 180 days cumulative gas production of about 9.2 million SCF per well. Company "D-u" completed 18.8% of the most productive wells (on average) in this asset with an average 180 days cumulative gas production of about 10.5 million SCF per well and Company "C-c" completed the 26.3% of the least productive wells (on average) in this asset with an average 180 days cumulative gas production of about 7.5 million SCF per well.

Figure 7:
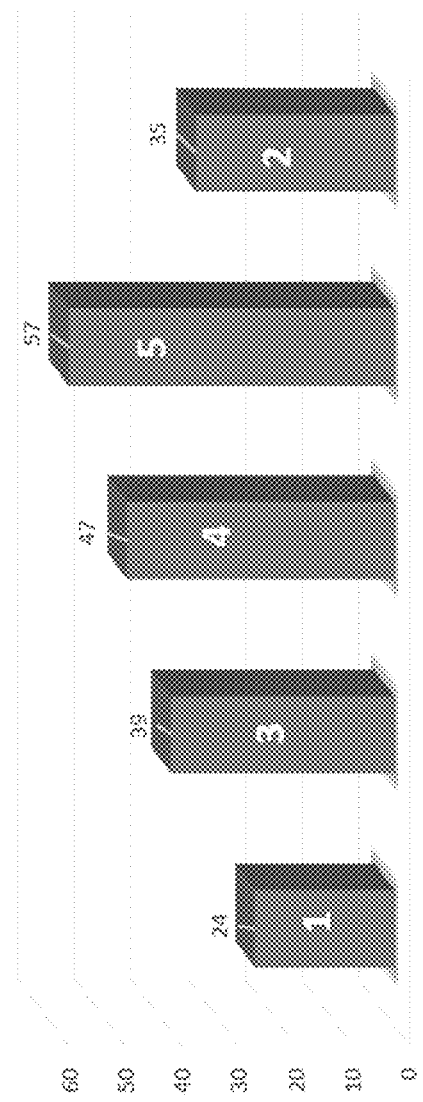
FIG. 7 is a graph illustrating an average Px of all wells that have been completed by each service company.

Based on the above data, an average "Px" may be determined for each service company, where "Px" denotes the location of the production indicator result on the probability distribution function generated by the Monte Carlo Simulation for each well. Turning to FIG. 7, "Px" is the average for all the wells completed by each of the service companies of FIGS. 5 and 6. This figure indicates that Company "A-o" had the best performance followed by Company "E-h", while Company "D-u" had the worst performance of all the five service companies.

Figure 8:
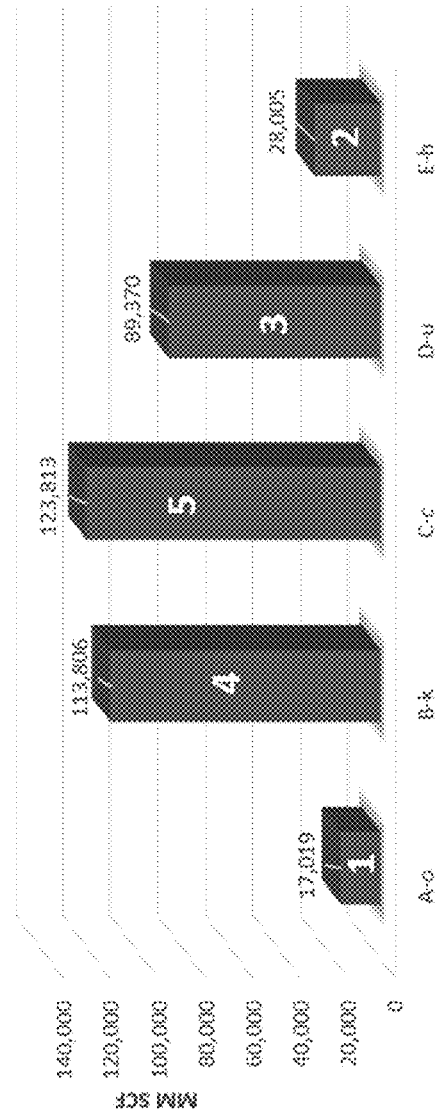
FIG. 8 is a graph illustrating a total production of less than P10 values for the wells that have been completed by each service company.
Figure 9:
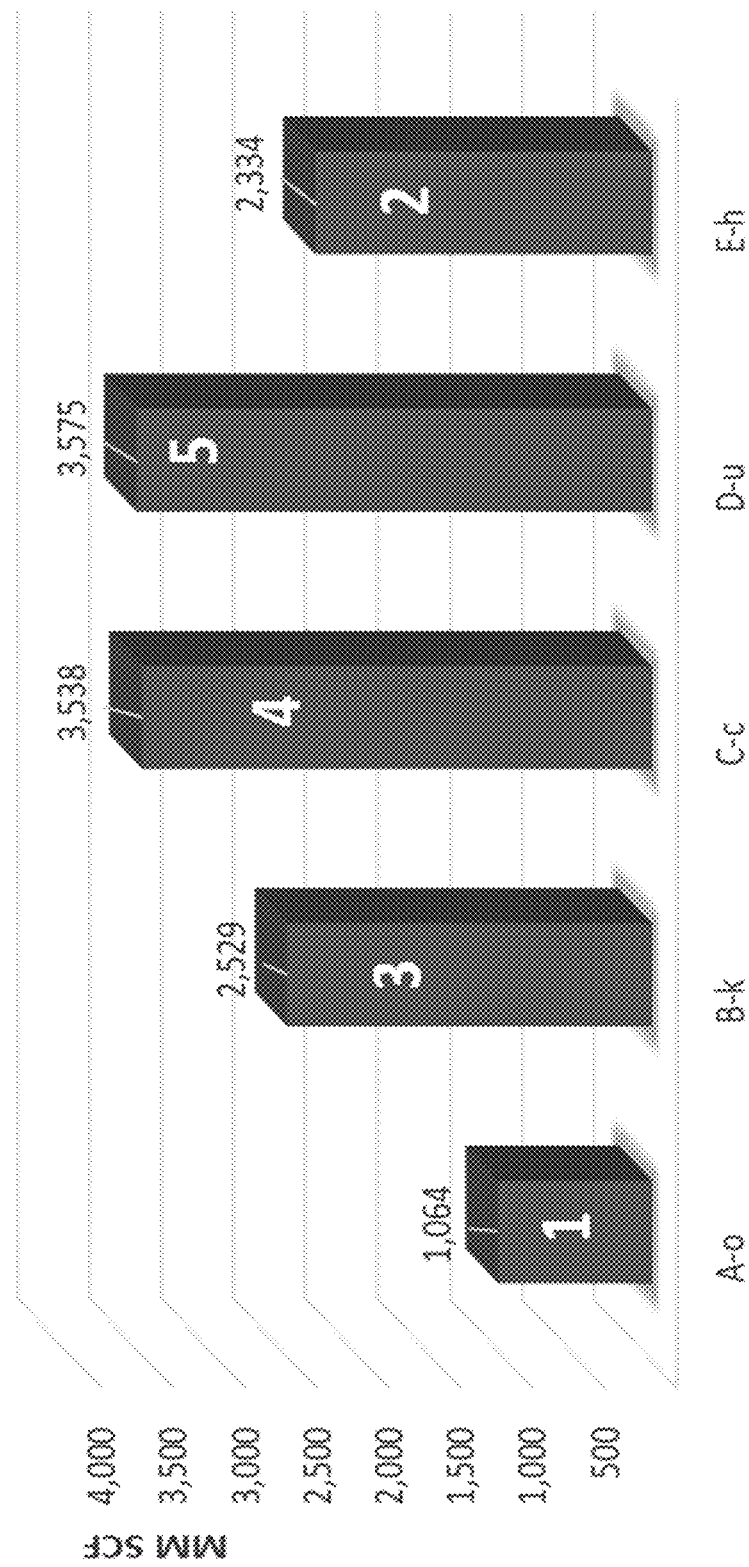
FIG. 9 is a graph illustrating an average production of less than P10 values for the wells that have been completed by each service company.

FIGS. 8 and 9 show actual production numbers. In FIG. 8, shows total production for each of the service companies below P10. The total production is calculated by subtracting, the actual production (180 days cumulative gas production) for each well from the P10 production that had been calculated for the well using the Monte-Carlo Simulation procedure explained in the look-back analysis described above to yield a result. The results were summed over all the wells that had been completed by each service company.

FIG. 9 shows an average per well production less than P10. Here, each average displayed in FIG. 9 is calculated by dividing the total production values (shown in FIG. 8) by the number of wells completed by each service company to arrive at an average value. Comparing the numbers shown in FIG. 5 through FIG. 9, one can conclude that completions and stimulations performed by the Service Company "A-o" is of highest quality completion and hydraulic fracturing practices these five service companies, followed by the Service Company "E-h". Furthermore, these figures show that Service Company "D-u" has demonstrated to have the poorest quality completion and hydraulic fracturing practices in this group of service companies.

As mentioned briefly above, the look-back analysis may be used to identify shale wells that may be potential candidates for hydraulic refracturing. In particular, the data-driven analytics approach to candidate selection in shale wells is intimately related to data-driven predictive model, and the look-back analysis. Further details related to the advanced data-driven analytics are described in U.S. patent application Ser. No. 14/777,153 entitled "Data-Driven Analytics, Predictive Modeling & Optimization of Hydraulic Fracturing in Marcellus Shale" filed on Sep. 15, 2015, the entirety of which is incorporated herein by reference. Upon the development (training and calibration) and validation of a data-driven predictive model, production or production indicators may be predicted from a shale well that is conditioned to a large number of field measurements with little to no human bias.

The data-driven predictive model calculates well production that is conditioned to well construction, reservoir characteristics, completion and hydraulic fracture parameters, and operational constraints to accurately predict shale well productivity while making the most use of all the field measurements. Interpretations and use of soft data are largely avoided. Using the data-driven predictive model provides the luxury of being able to modify some of the input parameters and examine their impact on model output (shale well's productivity). This is powerful tool for understanding the role of different parameters or group of parameters on shale well's productivity. Furthermore, given the fact that the data-driven predictive model has a small computational footprint (only a fraction of a second per execution) it can be executed a large number of times in a short period of time and therefore provide the means for studies that require large number of model execution such as uncertainty analysis.

For example, if for a given well, the operational constraints are modified, we can learn how the shale well will respond to changes to surface facilities (translated to wellhead pressure) and choke sizes. By modifying reservoir characteristics and monitoring the model's response (production from the shale well) we can learn the impact of different reservoir parameters and their role in controlling production from shale wells. Similarly, as was shown in section we can assess the importance of different completion practices on the production from a given well. It can easily be seen that the data-driven predictive model is a powerful tool in learning so much about the production behavior of a shale well. In this section we demonstrate the use of the data-driven predictive model and the insight gained from the Look-Back analysis, in order to identify and rank hydraulic refracturing candidates.

Figure 10:
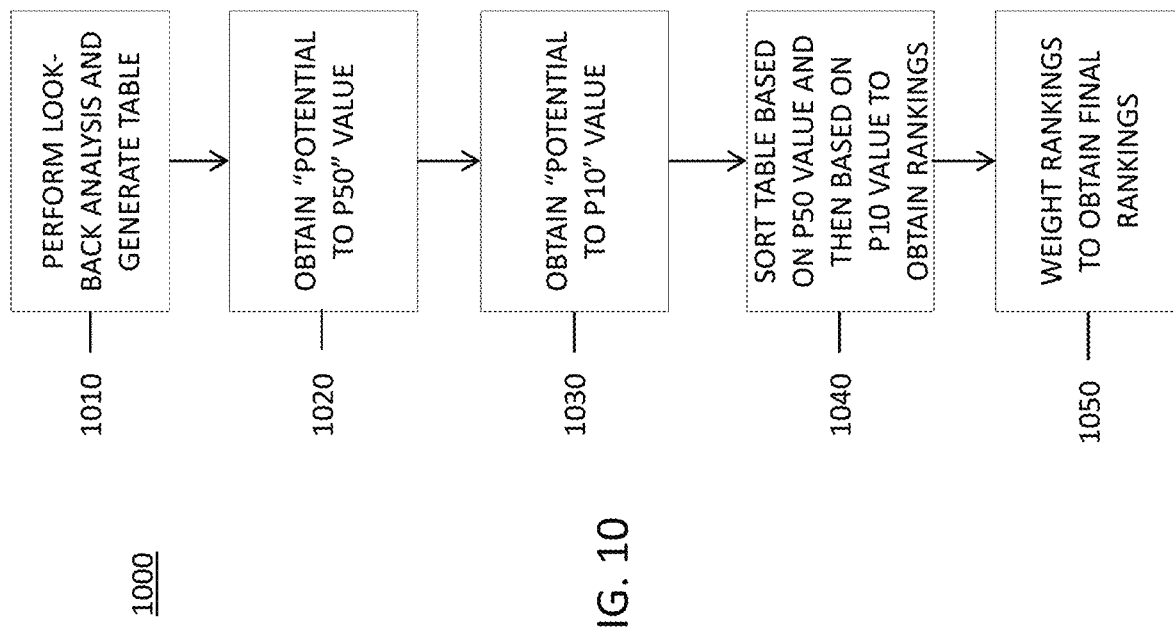
FIG. 10 is a flow diagram of a method of performing a data-driven analytics hydraulic refracturing candidate selection among a plurality of wells, in accordance with an embodiment.

FIG. 10 shows a process 1000 for identifying a hydraulic refracturing candidate using data-driven analytics, in accordance with an embodiment. At step 1010, the Look-Back Analysis is completed and a table is generated that includes all the wells in an asset being analyzed with corresponding P10, P50, and P90 values. In an embodiment, the table may include the actual well productivity. A sample of such a table generated for a Marcellus shale asset is shown below in Table 1.

TABLE 1

| ISI Coded | | MSCF | | | Actual Well | Output Prob- |
|---|---|---|---|---|---|---|
| Index | WellName | P10 | P50 | P90 | Productivity | ability |
| 1 | Well #0000001 | 10,008 | 5,327 | 4,816 | 4,816 | 58 |
| 2 | Well #0000002 | 17,325 | 13,612 | 9,523 | 15,582 | 27 |
| 3 | Well #0000003 | 17,535 | 14,511 | 10,879 | 11,520 | 85 |
| 4 | Well #0000004 | 13,699 | 10,329 | 7,256 | 7,685 | 85 |
| 5 | Well #0000005 | 15,568 | 12,223 | 9,199 | 13,629 | 29 |
| 7 | Well #0000007 | 17,482 | 14,182 | 9,306 | 17,859 | 6 |
| 8 | Well #0000008 | 18,025 | 15,705 | 12,136 | 13,117 | 82 |

TABLE 1-continued

| ISI Coded | | MSCF | | | Actual Well | Output Prob- |
|---|---|---|---|---|---|---|
| Index | WellName | P10 | P50 | P90 | Productivity | ability |
| 9 | Well #0000009 | 16,478 | 13,193 | 9,142 | 11,004 | 75 |
| 10 | Well #0000010 | 12,675 | 8,872 | 5,461 | 12,027 | 14 |
| 11 | Well #0000011 | 15,233 | 11,822 | 8,212 | 9,459 | 79 |
| 14 | Well #0000014 | 8,855 | 6,327 | 4,341 | 5,786 | 62 |
| 15 | Well #0000015 | 13,339 | 10,146 | 6,999 | 7,999 | 80 |
| 16 | Well #0000016 | 12,672 | 9,197 | 6,128 | 10,580 | 32 |
| 17 | Well #0000017 | 11,043 | 8,522 | 6,344 | 10,660 | 14 |
| 18 | Well #0000018 | 12,685 | 9,578 | 7,161 | 6,772 | 94 |
| 19 | Well #0000019 | 12,381 | 9,556 | 7,154 | 8,830 | 63 |
| 20 | Well #0000020 | 11,423 | 8,637 | 6,480 | 6,437 | 90 |
| 21 | Well #0000021 | 10,348 | 6,109 | 3,481 | 10,599 | 9 |
| 22 | Well #0000022 | 15,753 | 12,397 | 8,749 | 9,719 | 82 |
| 23 | Well #0000023 | 15,000 | 11,630 | 8,082 | 10,326 | 70 |
| 24 | Well #0000024 | 9,440 | 5,352 | 2,808 | 8,893 | 13 |
| 25 | Well #0000025 | 12,465 | 7,978 | 4,601 | 5,530 | 80 |
| 26 | Well #0000026 | 14,589 | 9,996 | 5,931 | 6,257 | 88 |
| 28 | Well #0000028 | 18,394 | 15,866 | 12,364 | 16,139 | 46 |
| 29 | Well #0000029 | 11,185 | 7,201 | 3,997 | 5,642 | 72 |
| 30 | Well #0000030 | 16,457 | 1,310 | 9,630 | 8,471 | 96 |
| 31 | Well #0000031 | 16,239 | 12,880 | 9,626 | 9,757 | 89 |
| 32 | Well #0000032 | 13,599 | 9,682 | 6,779 | 6,007 | 95 |
| 33 | Well #0000033 | 11,830 | 7,351 | 4,226 | 6,743 | 57 |
| 34 | Well #0000034 | 11,321 | 6,959 | 3,820 | 11,807 | 8 |
| 35 | Well #0000035 | 11,067 | 6,748 | 3,730 | 14,358 | 1 |
| 36 | Well #0000036 | 11,103 | 7,016 | 3,809 | 8,202 | 35 |
| 37 | Well #0000037 | 11,095 | 6,966 | 3,998 | 4,498 | 85 |
| 38 | Well #0000038 | 15,288 | 12,580 | 9,038 | 14,278 | 23 |
| 39 | Well #0000039 | 15,953 | 11,501 | 6,715 | 15,374 | 15 |
| 40 | Well #0000040 | 10,587 | 7,381 | 4,676 | 8,839 | 28 |
| 41 | Well #0000041 | 13,394 | 9,658 | 6,308 | 9,686 | 50 |
| 42 | Well #0000042 | 15,501 | 12,076 | 8,381 | 4,622 | 100 |
| 43 | Well #0000043 | 13,759 | 9,390 | 5,570 | 8,724 | 58 |
| 44 | Well #0000044 | 10,207 | 6,101 | 3,834 | 7,667 | 29 |
| 46 | Well #0000046 | 17,067 | 14,375 | 10,026 | 14,735 | 44 |

At step 1020, a "Potential to P50" value is obtained. In this regard, data indicating "Actual Well Productivity" for each of the wells is subtracted from the calculated P50 values to yield a "Potential to P50" value. The "Potential to P50" value represents the difference between the actual well production and the expected average production (P50) that should have been easily achieved from the corresponding well and is the first indicator of the amount of hydrocarbon that could have been recovered from that well, but was missed during the original hydraulic fracture operations.

At step 1030, a "Potential to P10" value is obtained. For example, data indicating "Actual Well Productivity" for each of the wells is subtracted from the calculated P10 values to yield a "Potential to P10" value. The "Potential to P10" value represents the difference between the actual well production and the expected best production (P10) that could have been achieved from the corresponding well and is a second indicator of the amount of hydrocarbon that could have been recovered, but was missed during the original hydraulic fracture operations. Both the "Potential to P50" values and "Potential to P10" values are indicated below in Table 2.

TABLE 2

| ISI Coded | | MSCF | | | Actual Well | Potential | Potential |
|---|---|---|---|---|---|---|---|
| Index | WellName | P10 | P50 | P90 | Productivity | (P10) | (P50) |
| 1 | Well #0000001 | 10,008 | 5,327 | 2,893 | 4,816 | 5,192 | 511 |
| 2 | Well #0000002 | 17,320 | 13,612 | 9,523 | 15,582 | 1,738 | −1,970 |
| 3 | Well #0000003 | 17,535 | 14,511 | 10,876 | 11,520 | 6,015 | 2,991 |
| 4 | Well #0000004 | 13,699 | 10,329 | 7,256 | 7,685 | 6,014 | 2,644 |
| 5 | Well #0000005 | 15,568 | 12,223 | 9,199 | 13,629 | 1,939 | −1,406 |

TABLE 2-continued

| Index | ISI Coded WellName | MSCF P10 | P50 | P90 | Actual Well Productivity | Potential (P10) | Potential (P50) |
|---|---|---|---|---|---|---|---|
| 7 | Well #0000007 | 17,458 | 14,182 | 9,306 | 17,859 | −374 | −3,677 |
| 8 | Well #0000008 | 18,025 | 15,705 | 12,136 | 13,117 | 4,908 | 2,588 |
| 9 | Well #0000009 | 16,478 | 13,193 | 9,253 | 11,004 | 5,474 | 2,189 |
| 10 | Well #0000010 | 12,675 | 8,872 | 5,461 | 12,027 | 648 | −3,155 |
| 11 | Well #0000011 | 15,233 | 11,822 | 8,212 | 9,459 | 5,774 | 2,363 |
| 14 | Well #0000014 | 8,855 | 6,327 | 4,341 | 5,786 | 3,069 | 541 |
| 15 | Well #0000015 | 13,339 | 10,146 | 6,999 | 7,999 | 5,340 | 2,147 |
| 16 | Well #0000016 | 12,672 | 9,197 | 6,128 | 10,580 | 2,092 | −1,383 |
| 17 | Well #0000017 | 11,043 | 8,522 | 6,344 | 10,660 | 383 | −2,138 |
| 18 | Well #0000018 | 12,685 | 9,578 | 7,161 | 6,772 | 5,913 | 2,806 |
| 19 | Well #0000019 | 12,381 | 9,556 | 7,154 | 8,880 | 3,501 | 676 |
| 20 | Well #0000020 | 11,423 | 8,637 | 6,480 | 6,437 | 4,986 | 2,200 |
| 21 | Well #0000021 | 10,438 | 6,109 | 3,481 | 10,599 | −161 | −4,490 |
| 22 | Well #0000022 | 15,753 | 12,397 | 8,749 | 9,719 | 6,034 | 2,678 |
| 23 | Well #0000023 | 15,000 | 11,630 | 8,082 | 10,326 | 4,674 | 1,304 |
| 24 | Well #0000024 | 9,440 | 5,352 | 2,808 | 8,893 | 547 | −3,541 |
| 25 | Well #0000025 | 12,465 | 7,978 | 4,601 | 5,530 | 6,935 | 2,448 |
| 26 | Well #0000026 | 14,589 | 9,996 | 5,931 | 6,257 | 8,332 | 3,739 |
| 28 | Well #0000028 | 18,394 | 15,866 | 12,364 | 16,139 | 2,255 | −273 |
| 29 | Well #0000029 | 11,185 | 7,201 | 3,997 | 5,642 | 5,543 | 1,559 |
| 30 | Well #0000030 | 16,457 | 13,110 | 9,630 | 8,471 | 7,986 | 4,639 |
| 31 | Well #0000031 | 16,239 | 12,880 | 9,626 | 9,757 | 6,482 | 3,123 |
| 32 | Well #0000032 | 13,599 | 9,682 | 6,779 | 6,007 | 7,592 | 3,675 |
| 33 | Well #0000033 | 11,830 | 7,351 | 4,226 | 6,743 | 5,087 | 608 |
| 34 | Well #0000034 | 11,321 | 6,959 | 3,820 | 11,807 | −486 | −4,848 |
| 35 | Well #0000035 | 11,067 | 6,748 | 3,730 | 14,358 | −3,291 | −7,610 |

At step 1040, the table is sorted from highest to lowest for the "Potential to P50" results and for the "Potential P10" results. These calculations and rankings are illustrated in Table 3 below.

TABLE 3

| Ranking | List of Candidates (P50) | Potential (P50) | List of Candidates (P10) | Potential (P10) |
|---|---|---|---|---|
| 1 | Well #0000042 | 7,454 | Well #0000066 | 11,369 |
| 2 | Well #0000066 | 6,810 | Well #0000042 | 10,879 |
| 3 | Well #0000119 | 6,515 | Well #0000079 | 9,954 |
| 4 | Well #0000079 | 5,289 | Well #0000065 | 9,352 |
| 5 | Well #0000135 | 4,937 | Well #0000068 | 9,084 |
| 6 | Well #0000068 | 4,716 | Well #0000119 | 8,762 |
| 7 | Well #0000030 | 4,639 | Well #0000026 | 8,332 |
| 8 | Well #0000065 | 4,410 | Well #0000050 | 8,053 |
| 9 | Well #0000085 | 4,334 | Well #0000067 | 8,026 |
| 10 | Well #0000067 | 4,099 | Well #0000030 | 7,986 |
| 11 | Well #0000050 | 3,743 | Well #0000085 | 7,617 |
| 12 | Well #0000026 | 3,739 | Well #0000032 | 7,592 |
| 13 | Well #0000136 | 3,720 | Well #0000135 | 7,587 |
| 14 | Well #0000032 | 3,675 | Well #0000080 | 7,562 |
| 15 | Well #0000031 | 3,123 | Well #0000136 | 7,187 |
| 16 | Well #0000003 | 2,991 | Well #0000081 | 7,022 |
| 17 | Well #0000080 | 2,942 | Well #0000025 | 6,935 |
| 18 | Well #0000081 | 2,924 | Well #0000037 | 6,597 |
| 19 | Well #0000018 | 2,806 | Well #0000031 | 6,482 |
| 20 | Well #0000022 | 2,678 | Well #0000090 | 6,340 |
| 21 | Well #0000004 | 2,644 | Well #0000049 | 6,070 |
| 22 | Well #0000008 | 2,588 | Well #0000022 | 6,034 |
| 23 | Well #0000037 | 2,468 | Well #0000003 | 6,015 |
| 24 | Well #0000025 | 2,448 | Well #0000004 | 6,014 |
| 25 | Well #0000011 | 2,363 | Well #0000018 | 5,913 |

A 

TABLE 3-continued

| Combined Ranking | Final Ranking | Final Candidates |
|---|---|---|
| 2 | 1 | Well #0000066 |
| 2.5 | 2 | Well #0000042 |
| 5 | 3 | Well #0000079 |
| 7.5 | 4 | Well #0000119 |
| 8 | 5 | Well #0000065 |
| 8 | 6 | Well #0000068 |
| 9.5 | 7 | Well #0000018 |
| 12.5 | 8 | Well #0000011 |
| 13 | 9 | Well #0000026 |
| 13.5 | 10 | Well #0000030 |
| 13.5 | 11 | Well #0000050 |
| 14 | 12 | Well #0000067 |
| 15.5 | 13 | Well #0000085 |
| 15.5 | 14 | Well #0000135 |
| 19 | 15 | Well #0000032 |
| 20 | 16 | Well #0000090 |
| 21 | 17 | Well #0000049 |
| 21.5 | 18 | Well #0000136 |
| 22.5 | 19 | Well #0000080 |
| 25 | 20 | Well #0000081 |
| 26.5 | 21 | Well #0000031 |
| 29 | 22 | Well #0000025 |
| 29.5 | 23 | Well #0000037 |
| 31 | 24 | Well #0000003 |
| 32 | 25 | Well #0000022 |
| 34.5 | 26 | Well #0000004 |
| 36 | 27 | Well #0000008 |

B →

At step 1050, using the rankings in the column indicated as "A" in Table 3, the ranking of "Potential to P50" values are weighted (for example, twice as much) relative to the ranking of "Potential to P10" and then combined to generate a final ranking, such as in the column indicated as "B" in Table 3, as shown above.

In still another embodiment, once the hydraulic refracturing candidates are identified, designs of the identified hydraulic refracturing candidates may be optimized using the data-drive analytics and look-back analysis. The objective of the design of a hydraulic refracturing job is to identify a treatment that is as close to optimum as possible. The optimum hydraulic refracturing job is defined as one that creates (activates) the largest possible network of highly conductive pathways into a wellbore through a shale reservoir to thereby maximize the amount of hydrocarbon that can be produced. In other words, the quality of the hydraulic refracturing job is judged based on the hydrocarbon production that is triggered and sustained. In this regard, field measurements are used as the basis of the design and analysis as sets of input-output records that will eventually guide modeling and design of hydraulic refracturing jobs in shale wells.

Figure 11:
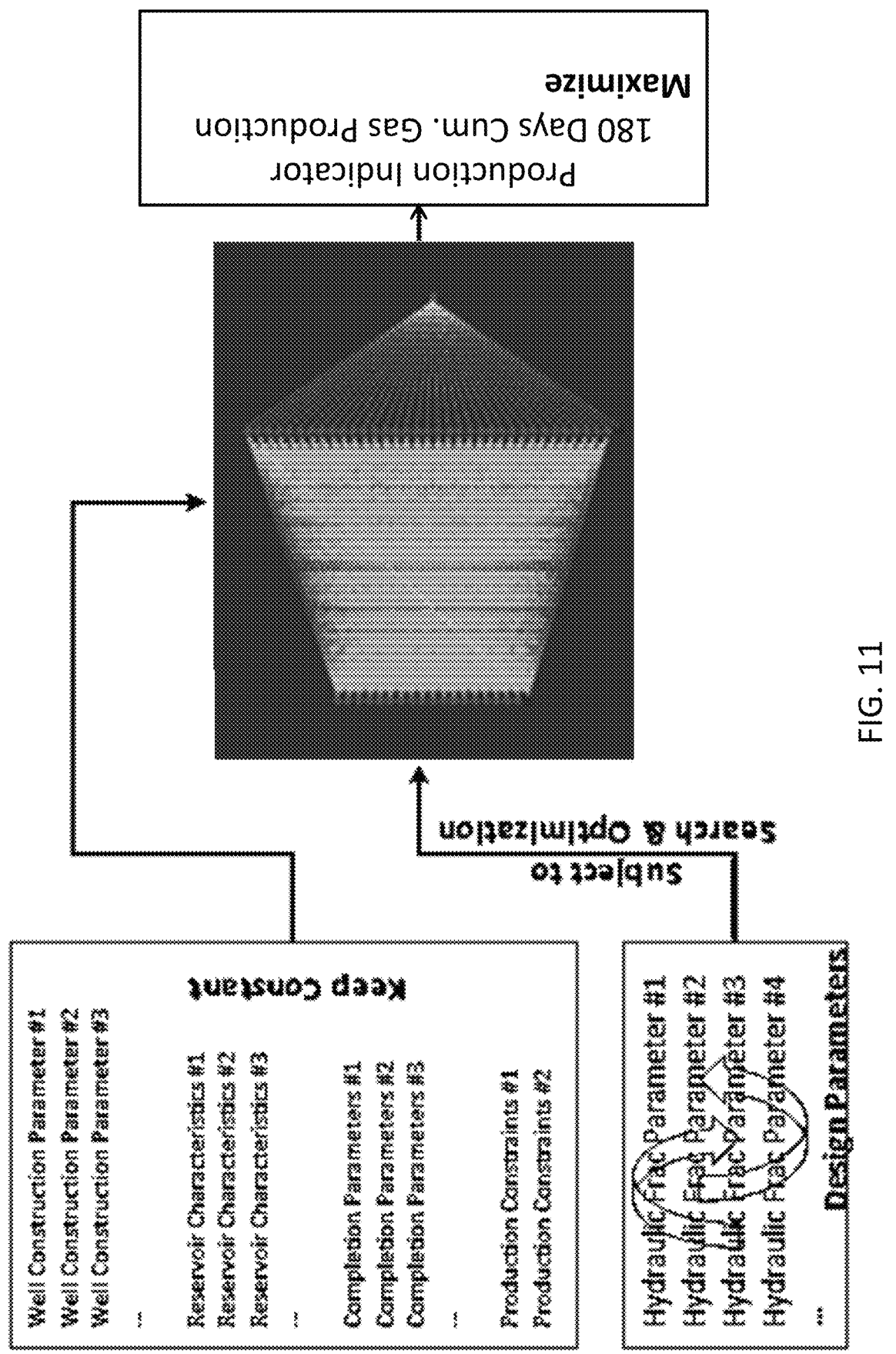
FIG. 11 is a schematic illustration of a search and optimization flow for the design of optimum hydraulic refracturing, in accordance with an embodiment.

To use data-driven analytics as a design tool, the data-driven predictive model is used as the objective function of a search and optimization algorithm. Search and optimization algorithms are developed in order to find the optimum combination of input parameters that results in the best output of a given objective function. Here, well productivity is defined as the result (output) of the objective function (a reference to which to compare effectiveness of hydraulic refracturing jobs in combination with reservoir characteristics) of the search and optimization algorithm. As such, similar to the processes discussed above, a combination of well construction, reservoir characteristics, completion practices, operational constraints, and hydraulic refracturing parameters serve as the input parameters. A schematic diagram of the flow chart is provided in FIG. 11.

Any one of numerous search and optimization algorithms may be implemented for the purposes identified above. In an embodiment, an evolutionary optimization technique called genetic algorithms may be implemented. Generally, evolutionary computing, and genetic algorithms specifically can combine exploration characteristics of an effective search algorithm with an enhanced ability of preserving and exploiting the knowledge acquired during every step of the search as a guide to take the next step to thereby provide an intelligent approach to more efficiently solve search, optimization, and design problems. The hydraulic refracturing design that is introduced here uses genetic algorithm as the search and optimization technology.

The optimization of hydraulic refracturing design can be applied to an entire asset, to a group of wells that are identified based on a common theme such as geographic location, reservoir characteristics, or production characteristics (such as common BTU range), or to an individual well. For the purposes of explaining the process, the design optimization algorithm is applied to the entire asset.

The main distinction between the hydraulic refracturing design technology and current methods is that actual completion practices in a given asset is used as the main design driver. Specifically, instead of using a current understanding of the completion and hydraulic fracturing in shale to design a hydraulic refracturing treatment, facts collected in the field (field measurements) drive the treatment design. Since it is generally unknown how shale's natural fracture network interacts with the induced fractures, the hydraulic refracturing design technology reduces the possibility of human bias in the design process. The hydraulic refracturing design technology evolves a new treatment design that is conditioned to all design details of a shale well (for example, well construction, reservoir characteristics and completion) through several generations, while tracking the characteristics of the most successful combination of design parameters and looking for distinctive patterns among these successful design parameter combinations.

Figure 12:
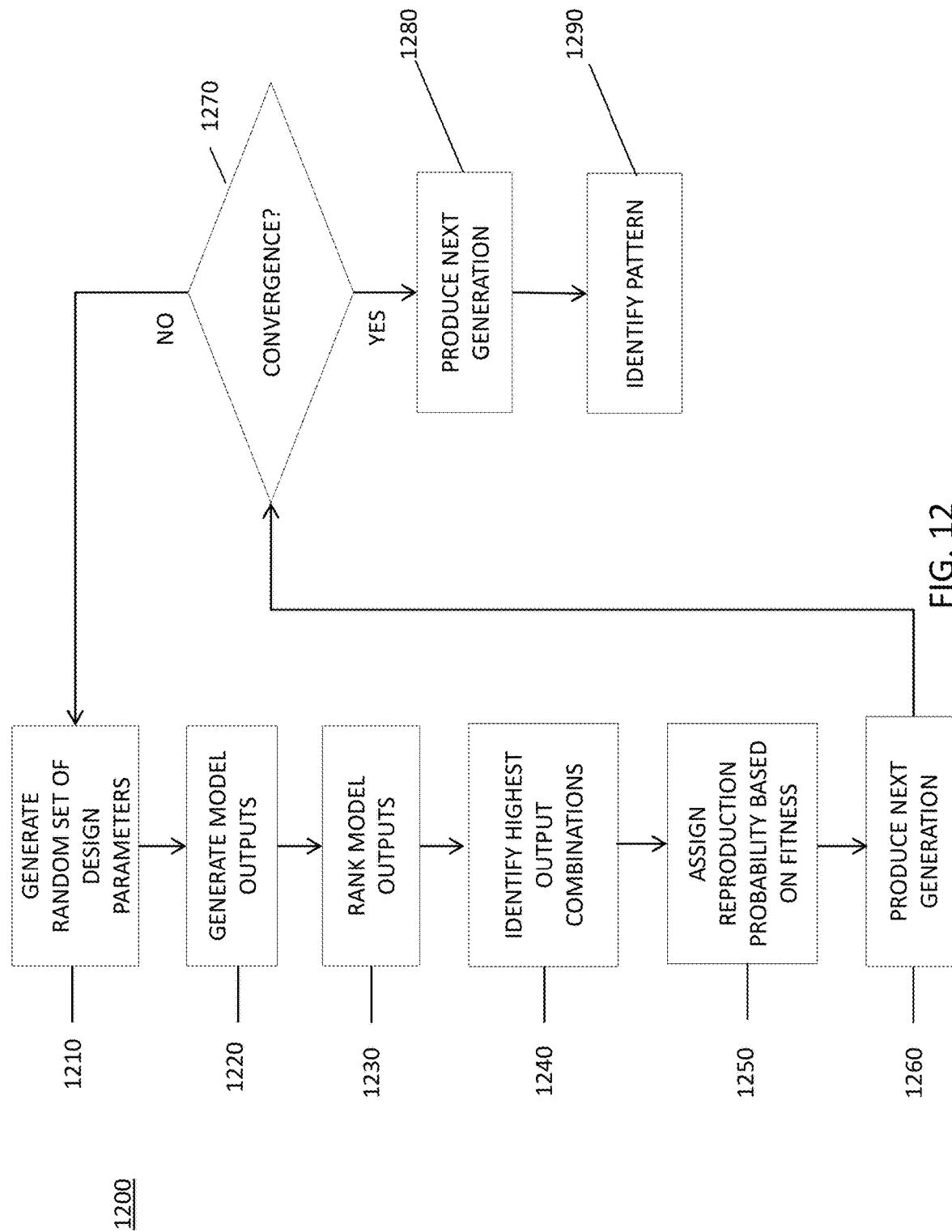
FIG. 12 is a flow diagram of a method of performing data-driven analytics to the design of optimum hydraulic refracturing.

FIG. 12 shows a method 1200 of optimizing a design of a hydraulic refracturing operation, according to an embodiment. The method 1200 is performed on every well in the asset.

At step 1210, a random set of design parameters is generated. In an embodiment, the design parameters that are the subject of optimization are identified and separated from other parameters. For example, design parameters are isolated from non-design parameters, which are not modified during the method 1200. In an embodiment of the method 1200, the design parameters include hydraulic fracturing parameters, while the non-design parameters includes well construction parameters, reservoir characteristics, completion parameters, and production constraints (similar to those described in more detail above with respect to method 100). The non-design parameters are referred to as "constant parameters." A large number (for example, one thousand) of realization of the combination of the design parameters are randomly generated. Each realization of the combination of design parameters is combined with the constant parameters to generate one set of input parameters to be applied to the data-driven predictive model.

Figure 13:
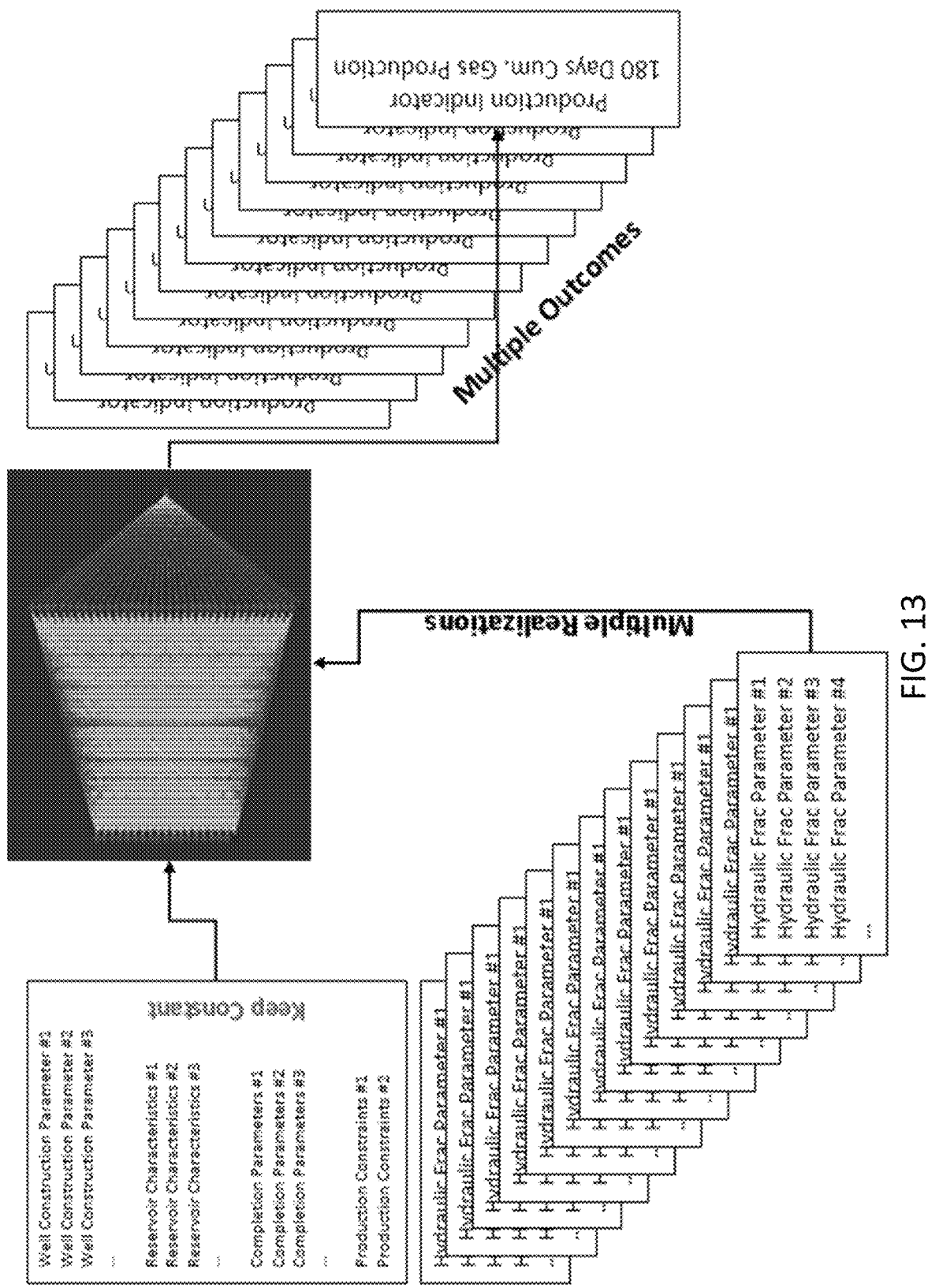
FIG. 13 is a schematic illustration of generating multiple realizations of designs for each individual well included in the method illustrated in FIG. 12.

At step 1220, model outputs are generated. In this regard, each set of input parameters obtained from step 1210 is applied to the data-driven predictive model to yield corresponding outputs. The outputs are referred to as "production indicator results." Upon completion of this step, thousands of values of the output parameter (i.e., production indicator result) for each well are obtained. Each production indicator result represents one randomly generated hydraulic refracturing design applied to the well showing a potential cumulative production of the well for a period of 180 days. Referring temporarily to FIG. 13, a simplified flow diagram is shown which illustrates the combination of the design parameters and the non-design parameters to output production indicator results. Referring back to FIG. 12, upon completion of step 1220, production indicator results corresponding to the well representing numerous possible production outcomes based on given set of characteristics (well construction, reservoir characteristics and completion) are provided.

Next at step 1230, the model outputs are ranked. The production indicator results are sorted from highest production to lowest production, with their corresponding combination of design parameters (collectively referred to as a "solution"). By sorting the design parameter combinations, the particular sets of combination responsible for highest production can be identified, at step 1240. The details of the well and design parameters are known and then are stored as part of the top design parameter combinations. By the end of this first generation, a collection of the top good hydraulic refracturing designs (design parameter combinations) are obtained for the corresponding well.

Figure 14:
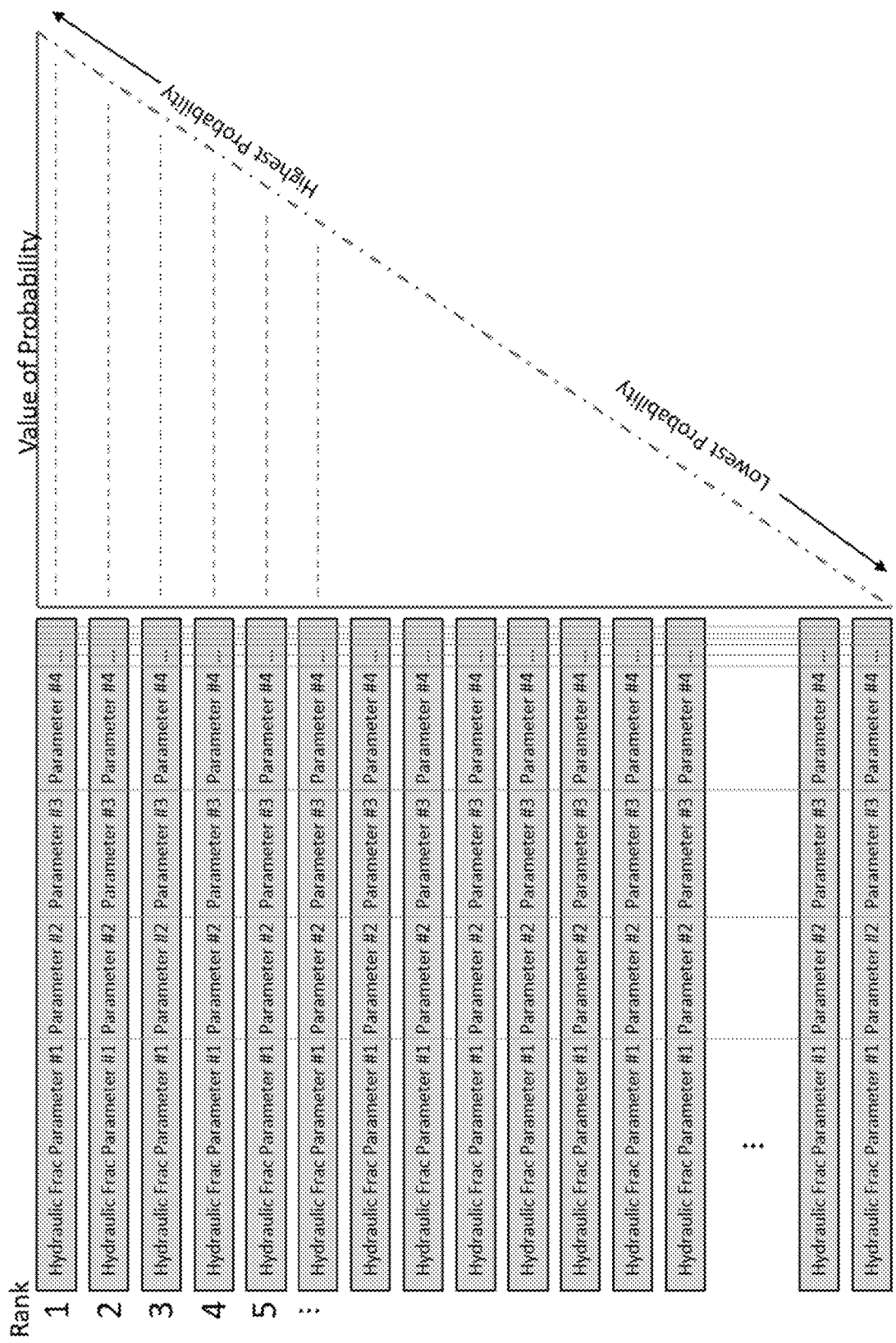
FIG. 14 is a schematic illustration of assigning reproducing probability to each individual solution based on fitness included in the method illustrated in FIG. 12.

Reproduction probability based on fitness is assigned at step 1250. A reproduction probability value is assigned to each individual solution based on its ranking generated in step 1240. Referring temporarily to FIG. 14, a schematic is shown, which illustrates a hypothetical probability assignment based on fitness. The values of the probability that are assigned in this step will be used during the selection of the parents that will produce the next generation of the hydraulic refracturing design solutions: the higher the reproduction probability of an individual solution, the higher the probability of that solution being selected as a parent and playing a role in the composition of the next generation of individual solutions.

Referring once again to FIG. 12, the next generation is then produced at step 1260. A large portion of the next generation of hydraulic refracturing designs are produced using the top solutions from the previous generation. Specifically, parents are selected from the previous generation based on their probability values assigned in step 1250. As noted above, solutions having higher probability values are more likely to be selected as a parent to produce a population of solutions for a new generation. The new generation is produced using genetic operators such as crossover, inversion, and mutation. In an embodiment, a large portion of the population of the new generation (for example, about 75%) is produced via cross over, while other genetic operators are used to produce a smaller amount of the new generation of solutions (for example, 5% each using inversion and mutation operators). Furthermore, a small percentage of the population of the previous or parent generation is used to move to the next generation, where the value of the probability plays an important role, again.

At step 1270, step 1220 through 1260 are repeated until a convergence is detected. In particular, once a new generation of solutions is produced, the method 1200 iterates at step 1220 and the process is repeated. Each time a cycle of the genetic optimization is completed during the evaluation of the robustness of the solutions that have been generated in step 1220, the algorithm must determine if convergence has been achieved. Convergence can be defined in multiple ways. For example, convergence can be achieved when no better individual (hydraulic refracturing design solution) is evolved after several generations. If convergence has not been achieved, steps 1220 through 1260 are repeated. If convergence has been achieved, the method 1200 continues to step 1280.

At step 1280, data from step 1250 is analyzed. In an example, an assumption is made that 145 generations should be generated before an optimum hydraulic refracturing design is evolved using the process enumerated above. Since the top of each generation of solutions (hydraulic refracturing design parameters) are being saved (e.g., 100 solutions), and because it took 145 generations to converge to the best solution, the top 14,500 solutions are saved upon completion of the above optimization process. These 14,500 solutions are among the fittest solutions of their corresponding generation.

Figure 15:
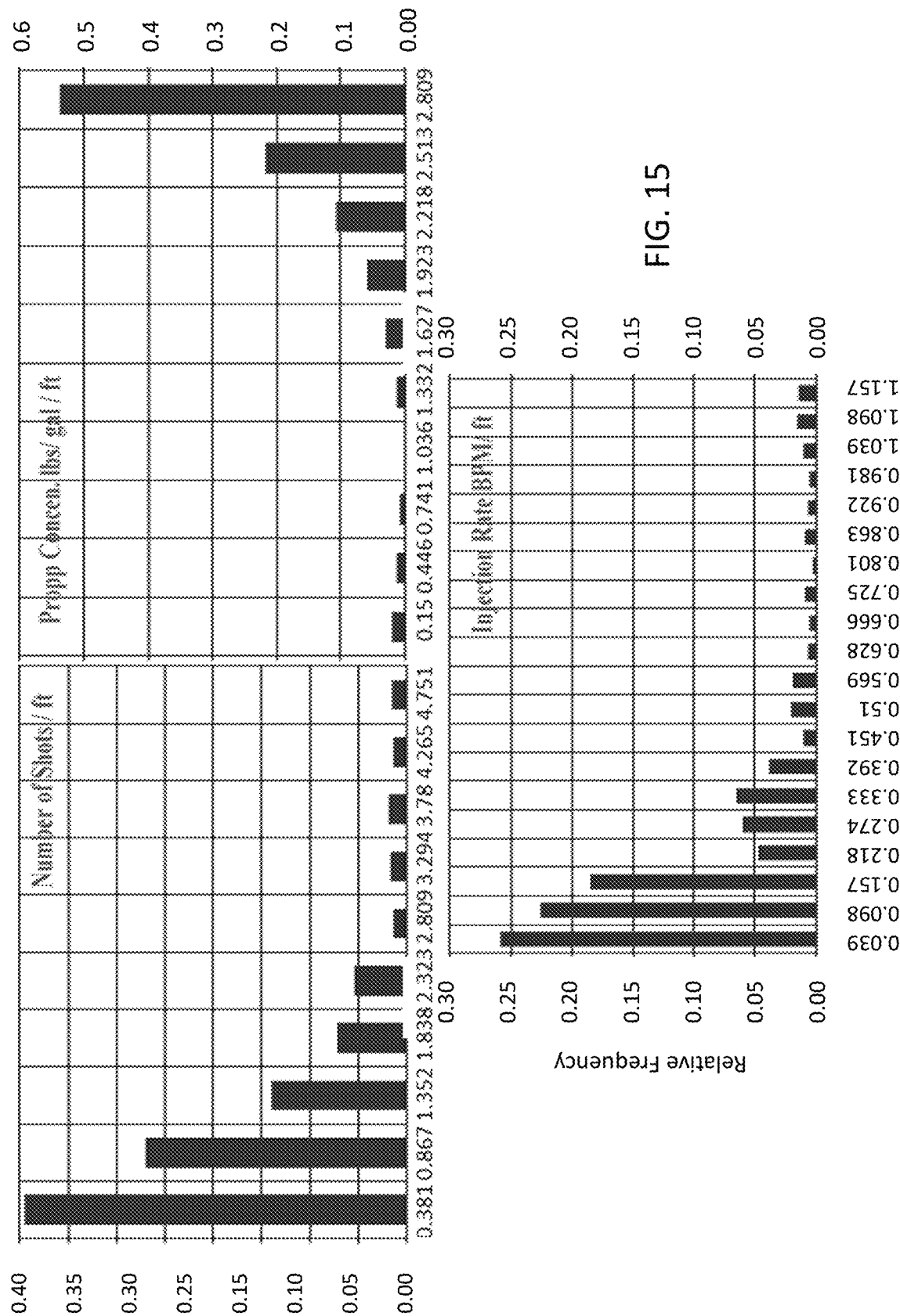
FIG. 15 are graphs illustrating results of evolving hydraulic refracturing design solutions using a genetic optimization algorithm for a well in the Utica shale asset.

The data may be further analyzed to determine whether any specific patterns or trends are recognized that can be associated with an optimum or best hydraulic refracturing design for a particular well. FIG. 15 is a trio of bar graphs each showing optimization results obtained from performing the above-described process on a shale well producing from Utica shale. The top-left bar graph A shows the frequency of the "Shot Density" (shots per ft. of completion) in the completion process. This bar chart clearly shows that an overwhelming percentage of the top solutions (hydraulic refracturing designs) have a small number of shot density. The top-right bar graph B shows a clear pattern of higher values of proppant concentration (lbs/gal/ft. of completion) for the top design solutions for this well. Finally, the bottom bar graph C shows that the best designs for this well includes mostly lower values of injection rates (BPM/ft. of completion).

From FIG. 15, a pattern may be detected in the top hydraulic refracturing designs that results in high production in this particular well. Therefore, in order to have a successful hydraulic refracturing, it is recommended that the numbers generated by this optimization algorithm be taken into consideration as much as is operationally feasible.

The embodiments disclosed herein are examples of the disclosure and may be embodied in various forms. For instance, although certain embodiments herein are described as separate embodiments, each of the embodiments herein may be combined with one or more of the other embodiments herein. Specific structural and functional details disclosed herein are not to be interpreted as limiting, but as a basis for the claims and as a representative basis for teaching one skilled in the art to variously employ the present disclosure in virtually any appropriately detailed structure. Like reference numerals may refer to similar or identical elements throughout the description of the figures.

The phrases "in an embodiment," "in embodiments," "in some embodiments," or "in other embodiments" may each refer to one or more of the same or different embodiments in accordance with the present disclosure. A phrase in the form "A or B" means "(A), (B), or (A and B)." A phrase in the form "at least one of A, B, or C" means "(A); (B); (C); (A and B); (A and C); (B and C); or (A, B, and C)."

Figure 16:
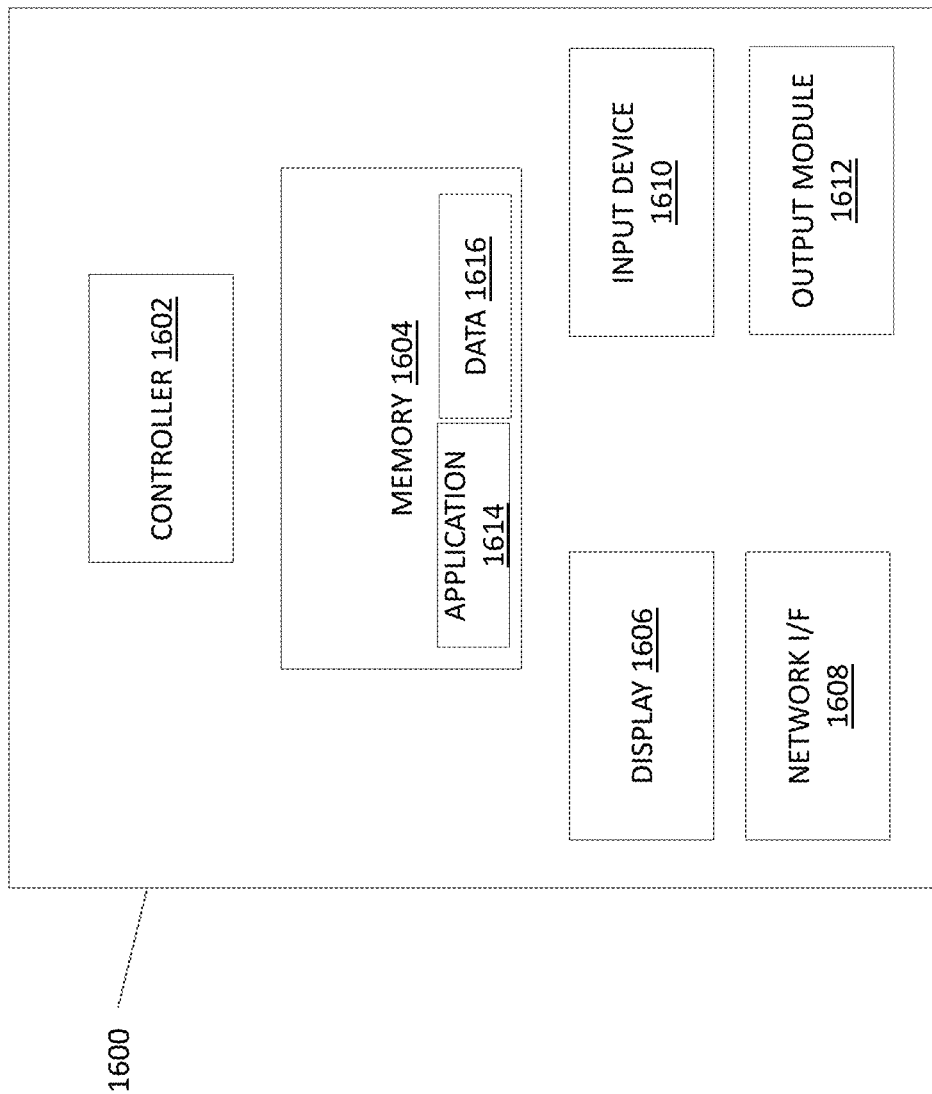
FIG. 16 is a schematic diagram of a computing device, in accordance with an embodiment.

The methods described herein may be executed using a computing device, a simplified block diagram of which is shown in FIG. 16. In an embodiment, the computing device 1600 includes one or more controllers 1602, a memory 1604, and optionally, a display 1606, a network interface 1608, an input device 1610, and/or an output module 1612. The one or more controllers 1602 are configured to receive various information and transform the received information to generate an output. The controller 1602 may include any type of computing device, computational circuit, or any type of processor or processing circuit capable of executing a series of instructions that are stored in a memory. The controller 1602 may include multiple processors and/or multicore central processing units (CPUs) and may include any type of processor, such as a microprocessor, digital signal processor, microcontroller, programmable logic device (PLD), field programmable gate array (FPGA), or the like. The controller may also include a memory to store data and/or instructions that, when executed by the one or more processors, causes the one or more processors to perform the one or more methods and/or algorithms.

Any of the herein described methods, programs, algorithms or codes may be converted to, or expressed in, a programming language or computer program. The terms "programming language" and "computer program," as used herein, each include any language used to specify instructions to a computer, and include (but is not limited to) the following languages and their derivatives: Assembler, Basic, Batch files, BCPL, C, C+, C++, Delphi, Fortran, Java, JavaScript, machine code, operating system command languages, Pascal, Perl, PL1, scripting languages, Visual Basic, metalanguages which themselves specify programs, and all first, second, third, fourth, fifth, or further generation computer languages. Also included are database and other data schemas, and any other meta-languages. No distinction is made between languages which are interpreted, compiled, or use both compiled and interpreted approaches. No distinction is made between compiled and source versions of a program. Thus, reference to a program, where the programming language could exist in more than one state (such as source, compiled, object, or linked) is a reference to any and all such states. Reference to a program may encompass the actual instructions and/or the intent of those instructions.

Any of the herein described methods, programs, algorithms or codes may be contained on one or more machine-readable media or memory 1604. The term "memory" may include a mechanism that provides (e.g., stores and/or transmits) information in a form readable by a machine such a processor, computer, or a digital processing device. For example, the memory 1604 may include a read only memory (ROM), random access memory (RAM), magnetic disk storage media, optical storage media, flash memory devices, or any other volatile or non-volatile memory storage device. Code or instructions contained thereon can be represented by carrier wave signals, infrared signals, digital signals, and by other like signals. The memory 1604 may store an application 1614 and/or data 1616, similar to data and values discussed above with respect to methods 100, 1000, and 1200. The application 1614 may, when executed by the controller 1602, cause one or more of the methods 100, 1000, 1200 to be performed and to cause the display 1606 to display the data, values, and/or outcomes of methods 100, 1000, and/or 1200. The network interface 1608 may be configured to connect to a network such as a local area network (LAN) consisting of a wired network and/or a wireless network, a wide area network (WAN), a wireless mobile network, a Bluetooth network, and/or the internet. Input device 1610 may be any device by means of which a user may interact with computing device 1600, such as, for example, a mouse, keyboard, foot pedal, touch screen, and/or voice interface. Output module 1612 may include any connectivity port or bus, such as, for example, parallel ports, serial ports, universal serial busses (USB), or any other similar connectivity port known to those skilled in the art.

It should be understood that the foregoing description is only illustrative of the present disclosure. Various alternatives and modifications can be devised by those skilled in the art without departing from the disclosure. Accordingly, the present disclosure is intended to embrace all such alternatives, modifications and variances. The embodiments described with reference to the attached drawing figures are presented only to demonstrate certain examples of the disclosure. Other elements, steps, methods, and techniques that are insubstantially different from those described above and/or in the appended claims are also intended to be within the scope of the disclosure.

The invention claimed is:

1. A computer-implemented method of identifying a well from a plurality of wells for hydraulic refracturing, the method comprising:
for each well of the plurality of wells:
generating a plurality of model outputs for the well based on executing a Monte Carlo simulation a predetermined number of times to produce the plurality of model outputs;
determining a range of productivity for the well by:
plotting the plurality of model outputs for the well in the form of a probability distribution function,
projecting an actual production indicator result for the well onto the probability distribution function,
comparing the actual production indicator result and the probability distribution function to identify a well production potential for the well, and
determining a quality of the well production potential based on a plurality of categorization rules including a lowest quality category and a highest quality category to obtain a result;
determining a difference between the actual production indicator result and an expected average production value for the well;
determining a difference between the actual production indicator result and an expected best production value for the well;
analyzing all of the wells in the plurality of wells to identify wells in the highest quality category based on the determined quality of well production potentials for the plurality of wells for hydraulic refracturing;
sorting results of the determined differences between the actual production indicator result and an expected average production value for all of the wells of the plurality of the wells from highest to lowest to obtain a first ranking;
sorting results of the determined difference between the actual production indicator result and an expected best production value for all of the wells of the plurality of the wells from highest to lowest to obtain a second ranking; and
weighting the first ranking relative to the second ranking and combining the rankings to generate a final ranking to identify candidate wells for hydraulic refracturing.

2. The method of claim 1, wherein the generating the plurality of model outputs includes using a first group of parameters and a second group of parameters to obtain corresponding production indicator results, the first group of parameters including well construction parameters, reservoir characteristic parameters and operational constraint parameters and the second group of input parameters including completion parameters and hydraulic fracturing parameters, wherein at least one parameter of the first group of parameters is a constant and the second group of parameters are varied.

3. The method of claim 2, wherein the reservoir characteristic parameters are constant.

4. The method of claim 3, wherein the well construction parameters are constant.

5. The method of claim 1, further comprising identifying a total number of wells that fall into each category defined by the plurality of categorization rules.

6. A non-transitory computer-readable storage medium storing instructions that when executed cause a computer to perform a method of identifying a well from a plurality of wells for hydraulic refracturing, the method comprising:
for each well of the plurality of wells:
generating a plurality of model outputs for the well based on executing a Monte Carlo simulation a predetermined number of times to produce the plurality of model outputs; and
determining a range of productivity for the well by:
plotting the plurality of model outputs in the form of a probability distribution function,
projecting an actual production indicator result for the well onto the probability distribution function,
comparing the actual production indicator result and the probability distribution function to identify a well production potential for the well,
determining a quality of the well production potential based on a plurality of categorization rules including a lowest quality category and a highest quality category;
determining a difference between the actual production indicator result and an expected average production value for the well; and determining a difference between the actual production indicator result and an expected best production value for the well;

analyzing all of the wells in the plurality of wells to identify wells in the highest quality category based on the determined quality of well production potentials for the plurality of wells for hydraulic refracturing;

sorting results of the determined differences between the actual production indicator result and an expected average production value for all of the wells of the plurality of the wells from highest to lowest to obtain a first ranking;

sorting results of the determined difference between the actual production indicator result and an expected best production value for all of the wells of the plurality of the wells from highest to lowest to obtain a second ranking; and weighting the first ranking relative to the second ranking and combining the rankings to generate a final ranking to identify candidate wells for hydraulic refracturing.

7. The non-transitory computer-readable storage medium of claim 6, wherein the generating the plurality of model outputs includes using a first group of parameters and a second group of parameters to obtain corresponding production indicator results, the first group of parameters including well construction parameters, reservoir characteristic parameters and operational constraint parameters and the second group of input parameters including completion parameters and hydraulic fracturing parameters, wherein at least one parameter of the first group of parameters is a constant and the second group of parameters are varied.

8. The non-transitory computer-readable storage medium of claim 7, wherein the reservoir characteristic parameters are constant.

9. The non-transitory computer-readable storage medium of claim 8, wherein the well construction parameters are constant.

10. The non-transitory computer-readable storage medium of claim 6, wherein the method further comprises identifying a total number of wells that fall into each category defined by the plurality of categorization rules.

11. A system for performing a method of identifying a well from a plurality of wells for hydraulic refracturing, the system comprising:

one or more processors; and a memory coupled to the one or more processors, having instructions stored thereon which when executed by the one or more processors cause the one or more processors to:

for each well of the plurality of wells:

generate a plurality of model outputs for the well based on executing a Monte Carlo simulation a predetermined number of times to produce the plurality of model outputs; and determine a range of productivity for the well by:

plot the plurality of model outputs in the form of a probability distribution function, project an actual production indicator result for the well onto the probability distribution function, compare the actual production indicator result and the probability distribution function to identify a well production potential for the well, determine a quality of the well production potential based on a plurality of categorization rules including a lowest quality category and a highest quality category, determine a difference between the actual production indicator result and an expected average production value for the well, and determine a difference between the actual production indicator result and an expected best production value for the well;

analyze all of the wells in the plurality of wells to identify wells in the highest quality category based on the determined quality of well production potentials for the plurality of wells for hydraulic refracturing sort results of the determined differences between the actual production indicator result and an expected average production value for all of the wells of the plurality of the wells from highest to lowest to obtain a first ranking;

sort results of the determined difference between the actual production indicator result and an expected best production value for all of the wells of the plurality of the wells from highest to lowest to obtain a second ranking; and weight the first ranking relative to the second ranking and combining the rankings to generate a final ranking to identify candidate wells for hydraulic refracturing.

12. The system of claim 11, wherein the memory further includes instructions, which when executed by the one or more processors, cause the one or more processors to use a first group of parameters and a second group of parameters to obtain corresponding production indicator results, the first group of parameters including well construction parameters, reservoir characteristic parameters and operational constraint parameters and the second group of input parameters including completion parameters and hydraulic fracturing parameters, wherein at least one parameter of the first group of parameters is a constant and the second group of parameters are varied.

13. The system of claim 12, wherein the reservoir characteristic parameters are constant.

14. The system of claim 13, wherein the well construction parameters are constant.

15. The system of claim 11, wherein the memory further includes instructions, which when executed by the one or more processors, cause the one or more processors to identify a total number of wells that fall into each category defined by the plurality of categorization rules.

\* \* \* \* \*